(12) United States Patent
Rahman et al.

(10) Patent No.: US 8,089,299 B1
(45) Date of Patent: Jan. 3, 2012

(54) INTEGRATED CIRCUIT WITH THROUGH-DIE VIA INTERFACE FOR DIE STACKING AND CROSS-TRACK ROUTING

(75) Inventors: Arifur Rahman, San Jose, CA (US); Bernard J. New, Carmel Valley, CA (US)

(73) Assignee: Xilinx, Inc., San Jose, CA (US)

( * ) Notice: Subject to any disclaimer, the term of this patent is extended or adjusted under 35 U.S.C. 154(b) by 342 days.

(21) Appl. No.: 12/436,918

(22) Filed: May 7, 2009

Related U.S. Application Data

(60) Provisional application No. 61/054,350, filed on May 19, 2008.

(51) Int. Cl.
*H03K 19/177* (2006.01)

(52) U.S. Cl. ............ 326/38; 326/41; 438/667; 438/109; 257/698; 257/692; 257/686; 257/E21.597; 257/E23.174; 257/208

(58) Field of Classification Search ............ 326/38, 326/41; 257/686, 698, 692, E23.174, E21.585, 257/E21.597, 208; 438/109, 667
See application file for complete search history.

(56) References Cited

U.S. PATENT DOCUMENTS

| | | | |
|---|---|---|---|
| 7,518,398 B1 | | 4/2009 | Rahman et al. |
| 7,605,458 B1 * | | 10/2009 | Rahman et al. ............... 257/686 |
| 7,619,441 B1 * | | 11/2009 | Rahman et al. .............. 326/38 |
| 7,701,251 B1 * | | 4/2010 | Rahman et al. ............... 326/41 |
| 7,727,896 B1 * | | 6/2010 | Rahman ....................... 438/700 |
| 7,781,879 B1 * | | 8/2010 | Rahman et al. ............... 257/686 |
| 7,930,661 B1 * | | 4/2011 | Trimberger et al. .......... 716/104 |
| 7,964,916 B2 * | | 6/2011 | Or-Bach et al. ............... 257/347 |
| 7,968,375 B1 * | | 6/2011 | Rahman et al. ............... 438/109 |
| 7,973,555 B1 * | | 7/2011 | Trimberger et al. ........... 326/38 |
| 2010/0295136 A1 * | | 11/2010 | Or-Bach et al. .............. 257/390 |
| 2011/0049577 A1 * | | 3/2011 | Or-Bach et al. .............. 257/209 |
| 2011/0199116 A1 * | | 8/2011 | Or-Bach et al. ................ 326/38 |

* cited by examiner

*Primary Examiner* — Mary Wilczewski
(74) *Attorney, Agent, or Firm* — Kenneth Glass; Thomas George

(57) ABSTRACT

An integrated circuit die is described that includes an array of tiles arranged in columns. The integrated circuit die includes interface tiles having at least one row of through die vias. The integrated circuit die includes metal layers that include horizontal wiring tracks and metal layers that include vertical wiring tracks. At least some of the metal layers having vertical wiring segments include horizontal wiring segments. Each horizontal wiring segment is coupled to a first wiring segment of a horizontal wiring track that is interrupted by the at least one row of through die vias and is coupled to a second wiring segment of the horizontal wiring track that is interrupted by the at least one row of through die vias. Each horizontal wiring segment extends between the at least one row of through die vias and at least one row of through die vias in an adjoining interface tile.

20 Claims, 16 Drawing Sheets

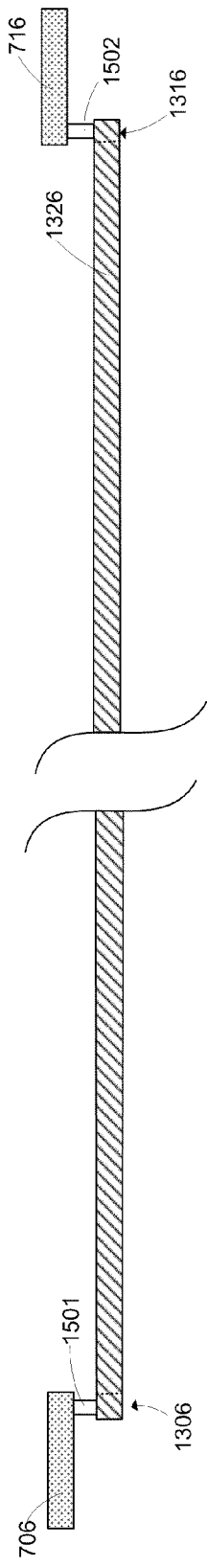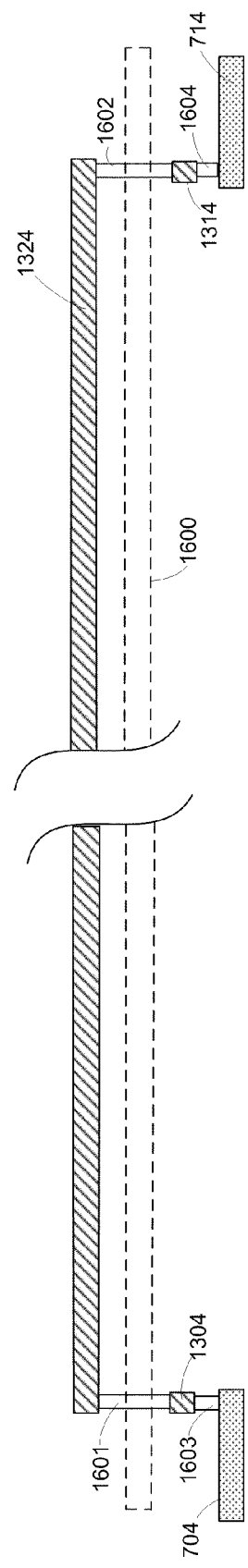

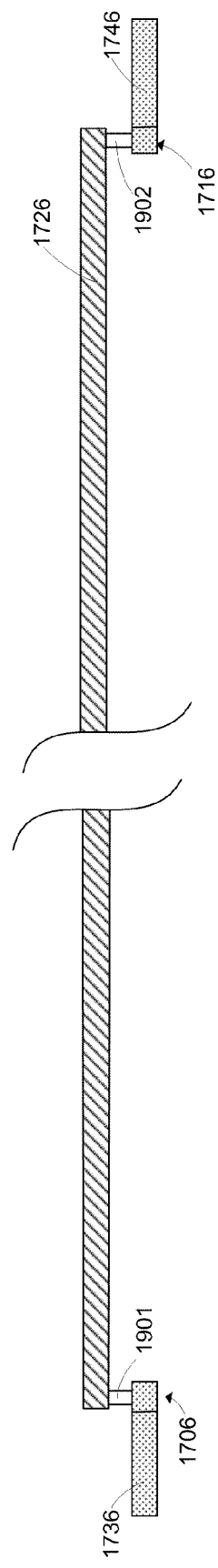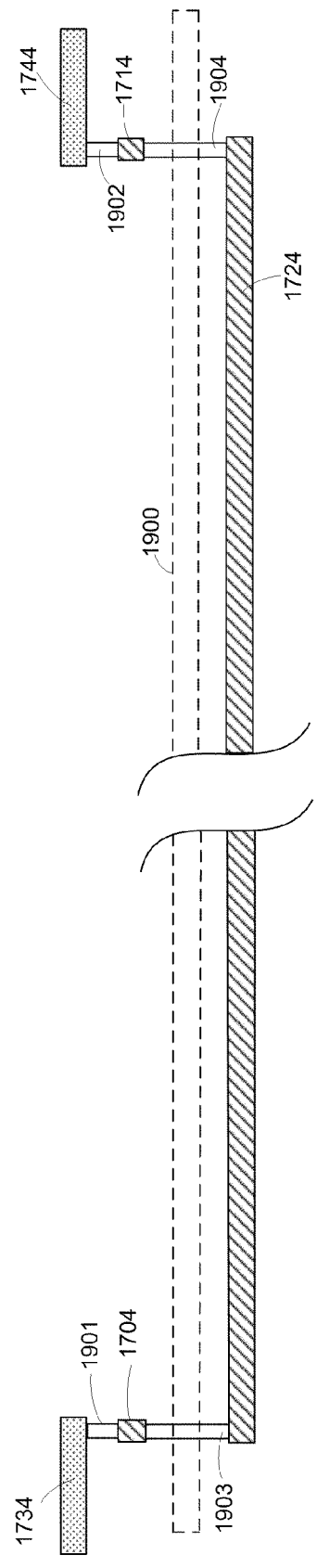

INTEGRATED CIRCUIT WITH THROUGH-DIE VIA INTERFACE FOR DIE STACKING AND CROSS-TRACK ROUTING

BACKGROUND OF THE INVENTION

Programmable logic devices (PLDs) exist as a well-known type of integrated circuit (IC) that may be programmed by a user to perform specified logic functions. There are different types of programmable logic devices, such as programmable logic arrays (PLAs) and complex programmable logic devices (CPLDs). One type of programmable logic device, known as a field programmable gate array (FPGA), is very popular because of a superior combination of capacity, flexibility, time-to-market, and cost.

An FPGA typically includes configurable logic blocks (CLBs), programmable input/output blocks (IOBs), and other types of logic blocks, such as memories, microprocessors, digital signal processors (DSPs), and the like. The CLBs, IOBs, and other logic blocks are interconnected by a programmable interconnect structure. The CLBs, IOBs, logic blocks, and interconnect structure are typically programmed by loading a stream of configuration data (known as a bitstream) into internal configuration memory cells that define how the CLBs, IOBs, logic blocks, and interconnect structure are configured. An FPGA may also include various dedicated logic circuits, such as digital clock managers (DCMs), input/output (I/O) transceivers, boundary scan logic, and the like.

As semiconductor technology has advanced, the amount and speed of logic available on an IC, such as an FPGA, has increased more rapidly than the number and performance of I/O connections. As a result, IC die stacking techniques have received renewed interest to address the interconnection bottleneck of high-performance systems. In stacked IC applications, two or more ICs are stacked vertically and interconnections are made between them.

One process for forming stacked-die integrated circuit devices, typically referred as a "via last" process forms through die vias after device and metal layers have been formed on the face side of the die. Metal layers are typically implemented in alternating layers of vertical and horizontal wiring tracks. More particularly, one layer will include only horizontal wiring tracks and the next layer will include only vertical wiring tracks. Wiring segments that extend within horizontal and vertical wiring tracks electrically connect with overlying and underlying structures using contacts and vias.

In the via-last process an additional metal layer is formed over the through die vias. This additional metal layer connects the through die vias to the wiring segments in the horizontal and vertical wiring tracks of underlying metal layers. The backside of the die is ground to expose the through die vias and contacts are formed on the backside of the first die that connect to the through die vias. The second die is then attached to the backside of the die, with the contacts electrically coupling the circuitry of the first die to the circuitry of the second die.

When a via-last fabrication process is used to form a FPGA die, because FPGA devices typically include columns of tiles that have uniform characteristics, it can be difficult to design the wiring of the layers that include horizontal and vertical wiring tracks. For example, if a column of tiles includes through die vias, since all of the wiring layers that include horizontal wiring tracks are interrupted by the through die vias, there may not be a sufficient number of uninterrupted wiring tracks to provide the needed connectivity. Accordingly, there exists a need in the art for a method and apparatus that will allow for increased connectivity across wiring tracks that are interrupted by through die vias.

SUMMARY OF THE INVENTION

In one aspect of the present invention a method for coupling wiring of a programmable logic device is described in which devices are formed on a semiconductor substrate, a first plurality of metal layers are formed that substantially comprise horizontal wiring tracks and a second plurality of metal layers are formed that substantially comprise vertical wiring tracks. The first plurality of metal layers and the second plurality of metal layers are electrically coupled to the devices. The method further includes forming rows of through die vias that extend through the first plurality of metal layers and the second plurality of metal layers, the rows of through die vias including at least one row of through die vias that extends within an interface tile, the at least one row of through die vias interrupting a first wiring track on the first plurality of metal layers, the first wiring track including a first wiring segment that extends on one side of the at least one row of through die vias and including a second wiring segment that extends on the opposite side of the at least one row of through die vias. The method further includes forming horizontal wiring segments in the second plurality of metal layers, the horizontal wiring segments including a first horizontal wiring segment that is electrically coupled on one end to the first wiring segment and that is electrically coupled on the other end to the second wiring segment so as to electrically couple the first wiring segment to the second wiring segment.

Another aspect of the present invention relates to an integrated circuit die having an array of tiles arranged in columns that includes an interface tile having at least one row of through die vias, a first plurality of metal layers that include horizontal wiring tracks and a second plurality of metal layers that include vertical wiring tracks, at least some of the second plurality of metal layers including horizontal wiring segments. Each horizontal wiring segment is coupled to a first wiring segment of a horizontal wiring track that is interrupted by the at least one row of through die vias and is coupled to a second wiring segment of the horizontal wiring track that is interrupted by the at least one row of through die vias, with each horizontal wiring segment extending between the at least one row of through die vias and at least one row of through die vias in an adjoining interface tile.

The method and apparatus of the present invention provide for connectivity of wiring tracks that are interrupted by through die vias, allowing for the fabrication of programmable logic devices having greater horizontal connectivity. These and other advantages of the present invention will become obvious to those of ordinary skill in the art after having read the following detailed description of the preferred embodiments, which are illustrated in the various drawings.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

FIG. 15 is a cross-sectional view that illustrates horizontal and vertical wiring segments that are on the same layer and that couple to wiring segments in a wiring track that is interrupted by a row of through die vias that extend in an overlying layer in accordance with an embodiment of the invention;

FIG. 16 is a cross-sectional view of a horizontal wiring segment of FIG. 13, that illustrates the horizontal and vertical wiring segments that couple wiring segments in a wiring track that is interrupted by a row of through die vias in accordance with an embodiment of the invention;

FIG. 19 is a cross-sectional view that illustrates an embodiment in which wiring segments in a wiring track that is interrupted by a row of through die vias and vertical wiring segments shown in FIG. 18 are coupled to a horizontal wiring segment that extends within an overlying layer in accordance with an embodiment of the invention;

FIG. 20 is a cross-sectional view that illustrates an embodiment in which wiring segments in a wiring track that is interrupted by a row of through die vias shown in FIG. 17 are coupled to horizontal and vertical wiring segments that extend within underlying layers in accordance with an embodiment of the invention.

DETAILED DESCRIPTION

Figure 1:
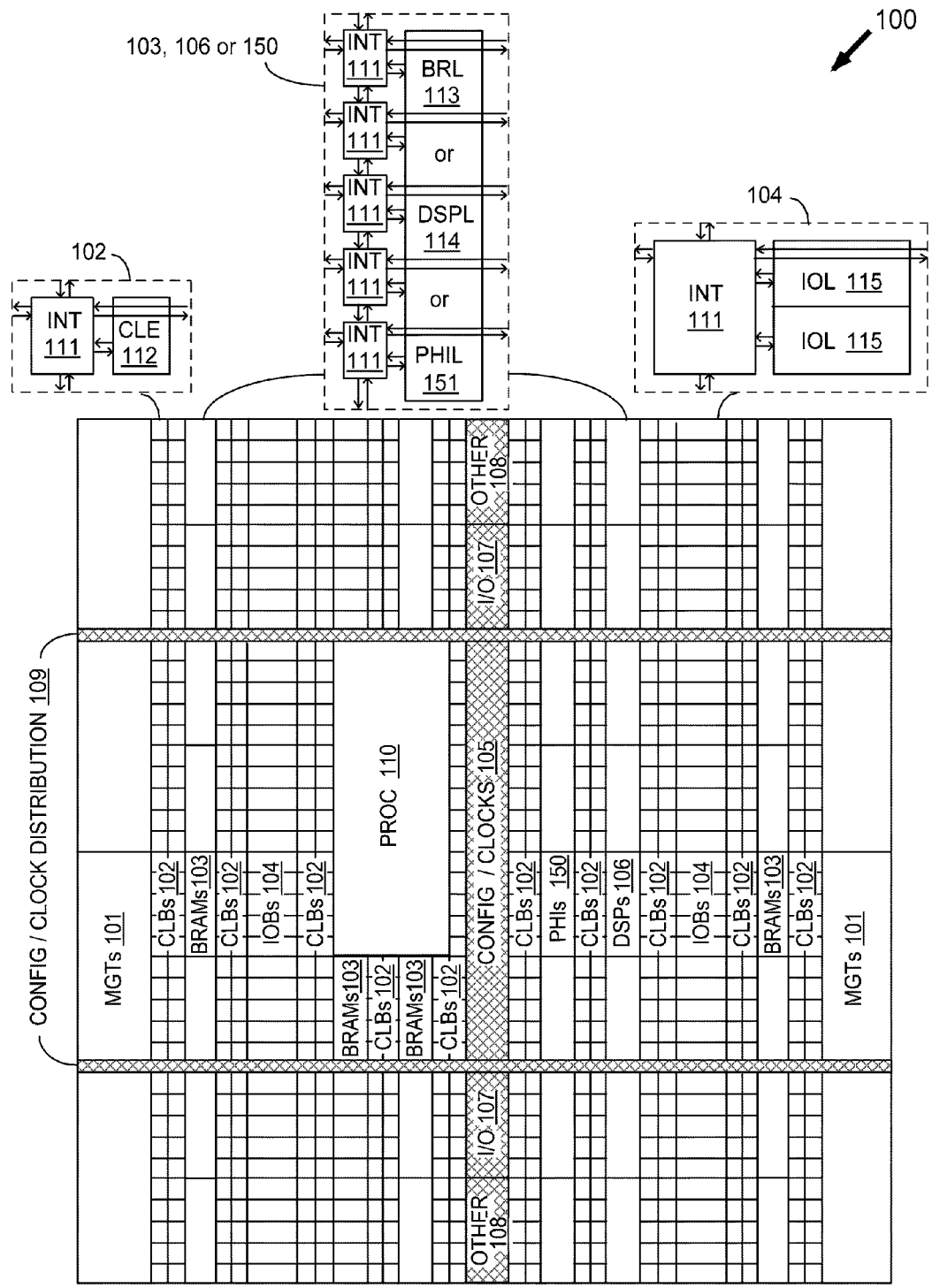
FIG. 1 is a block diagram depicting an FPGA in accordance with an embodiment of the invention.

Advanced FPGAs can include several different types of programmable logic blocks in the array. For example, FIG. 1 illustrates an FPGA architecture 100 that includes a large number of different programmable tiles including multi-gigabit transceivers (MGTs 101), configurable logic blocks (CLBs 102), random access memory blocks (BRAMs 103), input/output blocks (IOBs 104), configuration and clocking logic (CONFIG/CLOCKS 105), digital signal processing blocks (DSPs 106), specialized input/output blocks (I/O 107) (e.g., configuration ports and clock ports), and other programmable logic 108 such as digital clock managers, analog-to-digital converters, system monitoring logic, and so forth. Some FPGAs also include dedicated processor blocks (PROC 110).

In some FPGAs, each programmable tile includes a programmable interconnect element (INT 111) having standardized connections to and from a corresponding interconnect element in each adjacent tile. Therefore, the programmable interconnect elements taken together implement the programmable interconnect structure for the illustrated FPGA. The programmable interconnect element (INT 111) also includes the connections to and from the programmable logic element within the same tile, as shown by the examples included at the top of FIG. 1.

For example, a CLB 102 can include a configurable logic element (CLE 112) that can be programmed to implement user logic plus a single programmable interconnect element (INT 111). A BRAM 103 can include a BRAM logic element (BRL 113) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element (DSPL 114) in addition to an appropriate number of programmable interconnect elements. An IOB 104 can include, for example, two instances of an input/output logic element (IOL 115) in addition to one instance of the programmable interconnect element (INT 111). As will be clear to those of skill in the art, the actual I/O pads connected, for example, to the I/O logic element 115 are manufactured using metal layered above the various illustrated logic blocks, and typically are not confined to the area of the input/output logic element 115.

In the pictured embodiment, a columnar area near the center of the die (shown shaded in FIG. 1) is used for configuration, clock, and other control logic. Horizontal areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block PROC 110 shown in FIG. 2 spans several columns of CLBs and BRAMs.

Note that FIG. 1 is intended to illustrate only an exemplary FPGA architecture. For example, the numbers of logic blocks in a column, the relative width of the columns, the number and order of columns, the types of logic blocks included in the columns, the relative sizes of the logic blocks, and the interconnect/logic implementations included at the top of FIG. 1 are purely exemplary. For example, in an actual FPGA more than one adjacent column of CLBs is typically included wherever the CLBs appear, to facilitate the efficient implementation of user logic, but the number of adjacent CLB columns varies with the overall size of the FPGA.

FPGA 100 also includes one or more interface tiles 150 arranged in a column. In the present embodiment interface tiles 150, that can be referred to as programmable heterogeneous integration tiles (PHI) tiles, are operable for interconnection to one or more other integrated circuit die stacked on the backside of the die of FPGA 100. In the embodiment shown, FPGA architecture 100 includes a single column of interface tiles 150. Although only a single column of Interface tiles 150 is shown, it is to be understood that FPGA architecture 100 may generally include one or more columns of interface tiles 150. In other embodiments FPGA 100 may include less than an en entire column of interface tiles 150.

In the present embodiment each Interface tile 150 includes a programmable logic element 151, that can be referred to hereinafter as a programmable heterogeneous logic element (PHIL), in addition to an appropriate number of programmable interconnect elements.

Figure 2:
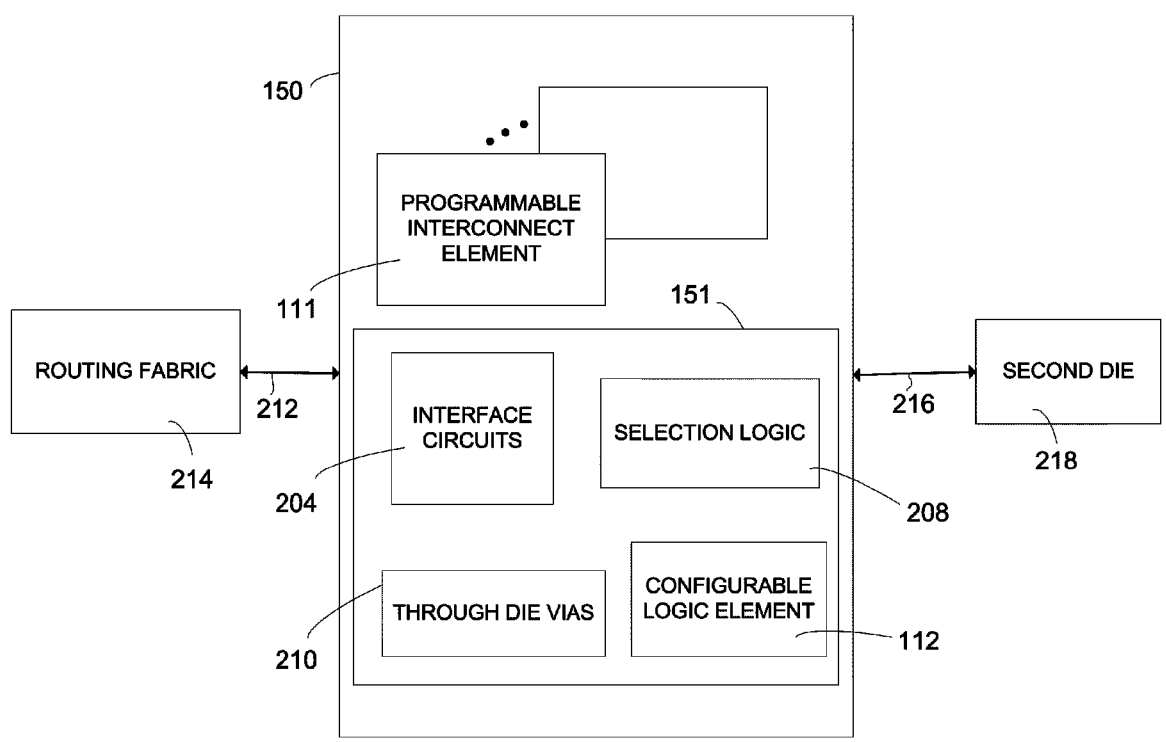
FIG. 2 is a block diagram depicting an interface tile in accordance with an embodiment of the invention.

In the embodiment shown in FIG. 2, an exemplary interface tile 150 is shown that includes one or more programmable interconnect elements 111 and a programmable logic element 151 that includes configurable logic element 112, interface circuits 204, selection logic 208, and a plurality of through die vias 210. Interface tile 150 includes an interface 212 to routing fabric 214 of the FPGA. The interface 212 includes various routing conductor segments that form part of the FPGA routing fabric 214. Interface tile 150 also includes an interface 216 with a second integrated circuit die 218 that includes a plurality of contacts formed on the backside of the FPGA die that are electrically coupled to conductive interconnect of the second die 218.

Each of the programmable interconnect elements 111 includes programmable multiplexing structures that couple the Interface tile 150 to the routing conductor segments of interface 212. Configurable logic element 112 includes one or more slices of logic having lookup tables (LUTs), multiplexers, flip-flops, and the like.

Interface circuits 204 facilitate communication between the FPGA routing fabric 214 and second die 218 through the through die vias 210. More particularly, through die vias 210 are electrically coupled to the contacts on the backside of the FPGA die and are electrically coupled to interface circuits 204. The selection logic 208 is configured to selectively change the function of Interface tile 150 between the functionality of a programmable logic tile (e.g., a CLB) and an interface function. In the present embodiment the interface function operably couples the second die 218 to routing fabric 214. For example, selection logic 208 may be configured such that signals received from FPGA routing fabric 214 are coupled to configurable logic element 112, and signals produced by configurable logic element 112 are coupled to FPGA routing fabric 214. In other words, selection logic 208 causes Interface tile 150 to operate similar to a CLB tile (e.g., CLB 102). Alternatively, selection logic 208 may be configured such that signals received from FPGA routing fabric 214 are coupled to second die 218 (through interface circuits 204 and through die vias 210) and signals produced by second die 218 are coupled to FPGA routing fabric 214 (through interface circuits 204 and through die vias 210). In other words, selection logic 208 cause Interface tile 150 to operate as an interface between FPGA routing fabric 214 and second die 218. The function of Interface tile 150 as implemented by selection logic 208 may be controlled by the configuration memory cells of the FPGA (not shown) or by a control signal either external to or internal to interface tile 150.

In some embodiments, interface circuits 204 provide voltage level translation. In some cases Interface tile 150 and the FPGA may operate using a different supply voltage than second die 218. In this embodiment interface circuits 204 translate the voltage of signals originating from FPGA routing fabric 214 and destined for second die 218 to the voltage required by second die 218. Likewise, interface circuits 204 translate the voltage of signals originating from second die 218 and destined for FPGA routing fabric 214 to the voltage required by the FPGA. In some embodiments, interface circuits 204 also provide for registering of signals coupled from FPGA routing fabric 214 to second die 218, and signals coupled from second die 218 to FPGA routing fabric 214.

Figure 3:
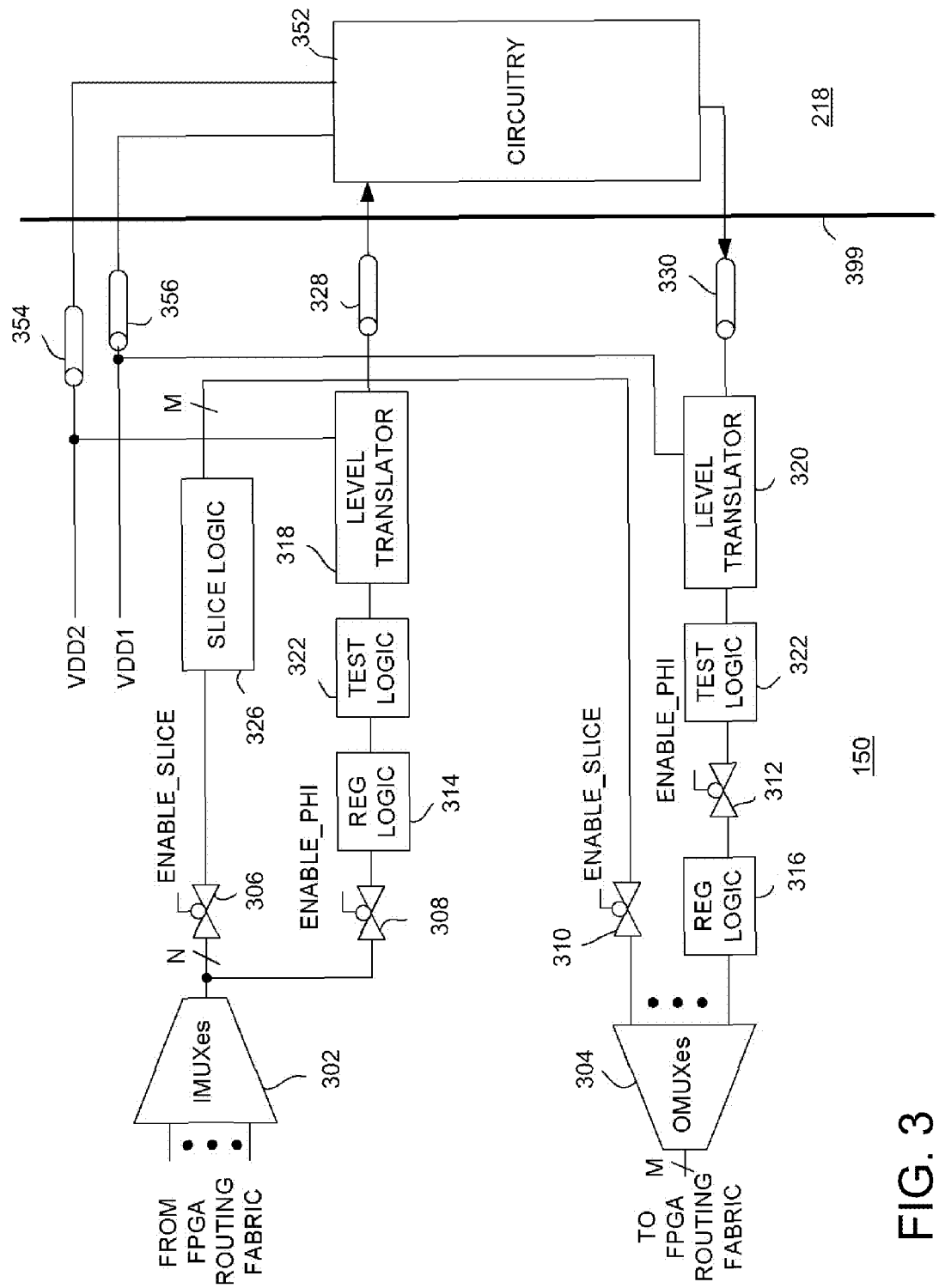
FIG. 3 is a block diagram depicting a more detailed embodiment of an interface tile in accordance an embodiment of the invention.

FIG. 3 is a block diagram depicting a more detailed embodiment of an exemplary Interface tile 150 that includes input multiplexing logic (IMUXes 302), output multiplexing logic (OMUXes 304), three-state buffers 306, 308, 310, and 312, register logic 314 and 316, level-translation circuits 318 and 320, test circuitry 322, slice logic 326, and Through die vias 328 and 330. With respect to FIG. 3, three-state buffers 306 through 312 comprise selection logic 208. Register logic 314, level-translation circuit 318, and test circuitry 322 comprise a first interface circuit of interface circuits 204. Register logic 316, level-translation circuit 320, and test circuitry 322 comprise a second interface circuit of interface circuits 204. The IMUXes 302 and OMUXes 304 comprise the programmable interconnect elements. The slice logic 326 comprises the configurable logic element.

Inputs of IMUXes 302 are coupled to FPGA routing fabric 214. An output of IMUXes 302 is coupled to inputs of three-state buffers 306 and 308, respectively. The output of the IMUXes 302 illustratively includes N terminals, where N is an integer greater than zero (i.e., IMUXes 302 include N multiplexers). IMUXes 302 are configured to couple selected routing conductors of the FPGA routing fabric to three-state buffers 306 and 308.

An output of three-state buffer 306 is coupled to an input of slice logic 326. Slice logic 326 includes a plurality of slices. Each of the slices includes various logic elements, including LUTs, flip-flops, combinatorial logic, and the like. An output of three-state buffer 308 is coupled to an input of register logic 314. Register logic 314 includes a plurality of registers (e.g., flip-flops). For example, register logic 314 may include N flip-flops, one for each terminal of the output of IMUXes 302.

A control input of three-state buffer 306 is configured to receive an enable_slice signal. A control input of three-state buffer 308 is configured to receive an enable_PHI signal. The enable_slice and enable_PHI signals may be generated externally to the Interface tile 150 or may be set by configuration memory cells. If the enable_slice signal is active, the outputs of IMUXes 302 are coupled to the slice logic 326. If the enable_slice signal is inactive, three-state buffer 306 provides a high-impedance output for slice logic 326. Likewise, if the enable_PHI signal is active, the outputs of IMUXes 302 are coupled to register logic 314. If the enable_PHI signal is inactive, three-state buffer 308 provides a high-impedance output for register logic 314. In this manner, the enable_slice and enable_PHI signals control whether IMUXes 302 drive slice logic 326 and/or register logic 314. In one embodiment, three-state buffers 306 and 308 are configured such that IMUXes 302 drive either slice logic 326 or register logic 314.

An output of slice logic 326 is coupled to an input of three-state buffer 310. The output of slice logic 326 is illustratively shown as having M terminals, where M is an integer greater than zero. An output of three-state buffer 310 is coupled to inputs of OMUXes 304. OMUXes 304 include M multiplexers. An output of three-state buffer 312 is coupled to an input of register logic 316. An output of register logic 316 is coupled to the inputs of OMUXes 304. Register logic 316 includes a plurality of registers (e.g., flip-flops). For example, register logic 316 may include M flip-flops. A control input of three-state buffer 310 is configured to receive the enable_slice signal. A control input of three-state buffer 312 is configured to receive the enable_PHI signal. Three-state buffers 310 and 312 operate in a manner similar to three-state buffers 306 and 308. An output of OMUXes 304 is coupled to FPGA routing fabric 214.

Using three-state buffers 306-312, Interface tile 150 may function as a CLB or as an interface tile for interfacing second die 218. Three-state buffers 306 and 310 may be active, causing input signals to pass from IMUXes 302 through slice logic 326, and output signals to pass from slice logic 326 to OMUXes 304. Alternatively, three-state buffers 308 and 312 may be active, causing input signals to pass from IMUXes 302 through register logic 314, level-translation circuit 318, test circuitry 322, and through die vias 328 to circuitry 352 on second die 218, and output signals to pass through die vias 330, test circuitry 322, level-translation circuit 320, and register logic 316 to the OMUXes 304.

An output of register logic 314 is coupled to an input of the level-translation circuit 318 through test circuitry 322. An output of level translation circuit 318 is coupled to through die vias 328. Through die vias 328 are electrically coupled to circuitry 352 in second die 218. Second die 218 is electrically and mechanically coupled to the backside of the die of the FPGA die that includes interface tile 150. The circuitry 352 is illustratively configured to receive a pair of voltage supplies, denoted as VDD1 and VDD2. The voltage supplies VDD1 and VDD2 are provided to second die 218 through the through die vias 354 and 356, respectively. In the present embodiment through die vias 354 and 356 are part of interface tile 150. However, alternatively, through die vias 354 and 356 may be located externally to the interface tile 150. Through die vias 354 and 356 receive the supply voltages VDD1 and VDD2 from external I/O pads of the FPGA or from voltage regulation logic on the FPGA (not shown). A line 399 demarcates the boundary between the FPGA die that includes Interface tile 150 and second die 218.

Another input of the level-translation circuit 318 is configured to receive the supply voltage VDD2. Assume the FPGA (and hence the interface tile 150) operates using the voltage supply VDD1, and the circuitry 352 of second die 218 operates using the voltage supply VDD2. The level-translation circuit 318 is configured to translate the voltage of signals received from the register logic 314 from VDD1 to VDD2. This allows the signals provided by the register logic 314 to properly drive the circuitry 352.

In the present example, through die vias 328 include N through die vias for providing N signals to circuitry 352 in second die 218. In the present embodiment through die vias 330 include M through die vias for receiving M signals from the circuitry 352 in the second die 218. Through die vias 330 are electrically and mechanically coupled to the backside of the FPGA die that includes interface tile 150. An input of level-translation circuit 320 is electrically coupled to through die vias 330. An output of level translation circuit 320 is coupled to an input of three-state buffer 312 through test logic 322. Test logic 322 cooperates with corresponding test circuitry on second die 218 to provide a scan chain.

Another input of the level-translation circuit 320 is configured to receive the supply voltage VDD1. Level-translation circuit 320 is configured to translate the voltage of signals received from the circuitry 352 in second die 218 from VDD2 to VDD1. This allows the signals provided by second die 218 to properly drive circuitry in the FPGA that uses the VDD1 supply voltage.

Figure 4:
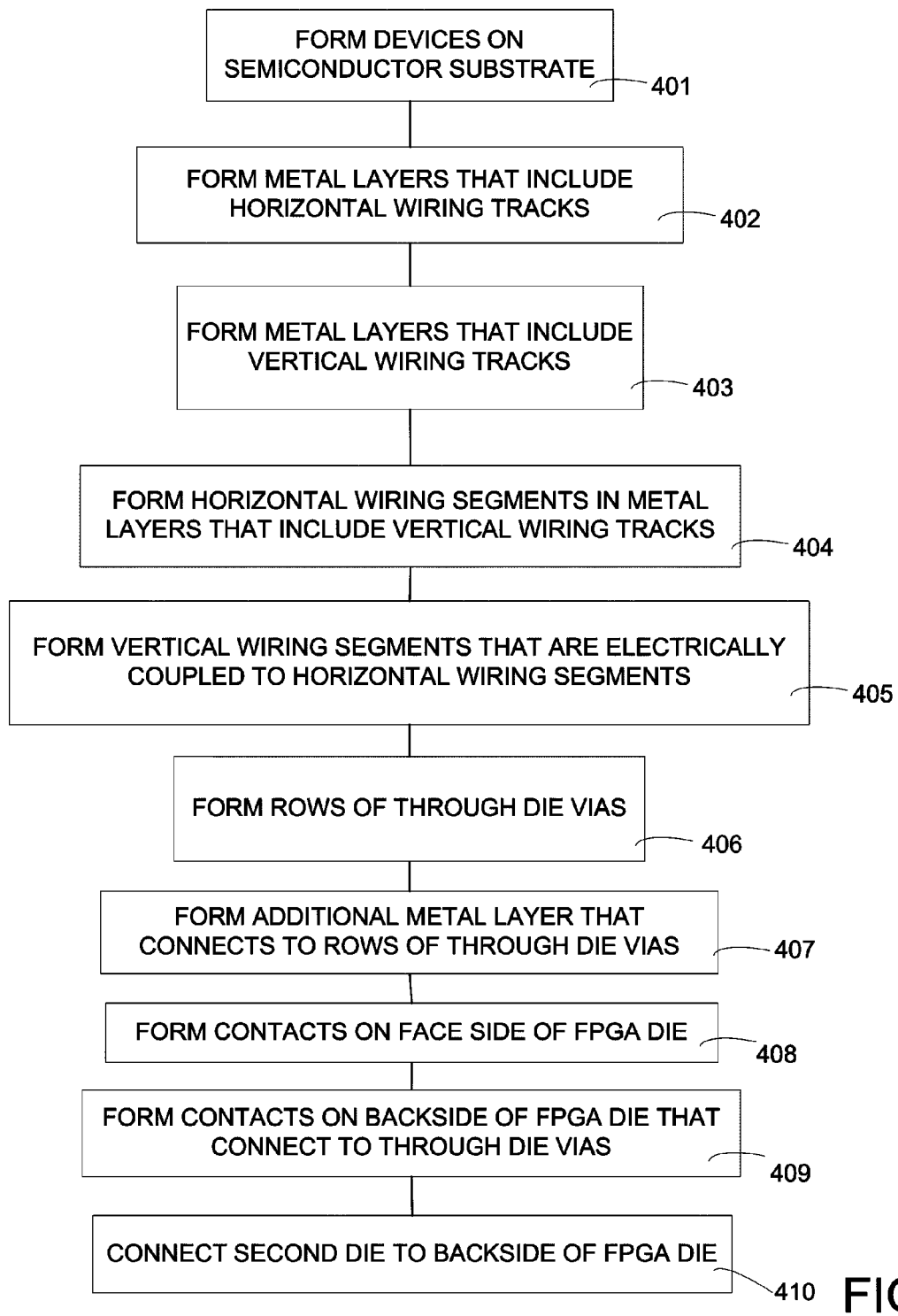
FIG. 4 is a block diagram depicting a method for coupling wiring of a programmable logic device in accordance with an embodiment of the invention.

FIG. 4 shows a method for coupling wiring of a programmable logic device. As shown by step 401 devices are formed on a semiconductor substrate. In the embodiment shown in FIG. 5, step 401 forms devices, represented by exemplary transistor 504 formed on semiconductor substrate 503. In the present embodiment an integrated circuit design process is used to generate an integrated circuit design layout in which the devices are represented in hierarchal form in a database that can be stored in a data storage device. The layers of the integrated circuit design layout that define the devices can be referred to as "device layers". In the present embodiment a netlist and/or a layout editor is used to generate the layout of the device layers.

Referring now to step 402 metal layers are formed that include horizontal wiring tracks. In step 403, metal layers are formed that include vertical wiring tracks. In the embodiment shown in FIG. 5, steps 402-403 form metal layers 511-516 that electrically couple to the devices formed on semiconductor substrate 503. In the present embodiment metal layers 511, 513 and 515 include horizontal wiring tracks and metal layers 512, 514 and 516 include vertical wiring tracks.

Referring to step 404, horizontal wiring segments are formed in the metal layers that include the vertical wiring tracks. In step 405 vertical wiring segments are formed that electrically couple to the horizontal wiring segments.

In the present embodiment, steps 402-405 are performed by adding horizontal wiring tracks (step 402) to one or more layers of a semiconductor design layout, adding vertical wiring tracks (step 403) to one or more layers of the semiconductor design layout, adding horizontal wiring segments (step 404) to at least some of the layers of the semiconductor design layout that include vertical wiring tracks, and adding vertical wiring segments (step 405) to one or more layers of the semiconductor design.

In one embodiment all of the vertical wiring segments of step 405 are in the one or more layers of the semiconductor design that include vertical wiring tracks. In another embodiment, the vertical wiring segments added in step 405 are in layers of the semiconductor design that include horizontal wiring tracks. In other embodiments, some of the vertical wiring segments added in step 405 are in the layers of the semiconductor design that include horizontal wiring tracks and some are in layers of the semiconductor design that include vertical wiring tracks.

In the present embodiment, other than the horizontal wiring segments formed in step 404, all of the wiring on each metal layer 512, 514 and 516 extends vertically. Accordingly, with the exception of the horizontal wiring segments formed in step 404, none of the wiring on metal layers 512, 514 and 516 will extend horizontally. Also, other than the vertical wiring segments formed in step 405, all of the wiring on each metal layer 511, 513 and 515 extends horizontally. Accordingly, with the exception of the vertical wiring segments formed in step 405, none of the wiring on metal layers 511, 513 and 515 will extend vertically.

In another embodiment, with the exception of the horizontal wiring segments formed in step 404, substantially all of the wiring on each metal layer 512, 514 and 516 extends vertically. In this embodiment, with the exception of the vertical wiring segments formed in step 405, substantially all of the wiring on each metal layer 511, 513 and 515 extends horizontally.

In step 406 rows of through die vias are formed that extend through the metal layers formed in steps 402-405. In the embodiment shown in FIG. 5 the rows of through die vias formed in step 406 are represented by an exemplary through die via 505 that extends through semiconductor substrate 503 and metal layers 511-516.

In the present embodiment, integrated circuit die 501 is formed using a via-last fabrication process in which one or more device layers are formed over a semiconductor wafer and metal layers 511-517 are formed over the device layers, with dielectric layers disposed between each metal layer 511-517. Metal layers 511-516 can be formed by depositing a metal layer and patterning the metal layer using mask and etch process steps, where the masks are defined by the integrated circuit design layout that includes, in addition to the wiring segments of the horizontal and vertical wiring tracks, the horizontal and vertical wiring segments of steps 404-405. Through die vias are then formed by an etching process step that etches past layers 511-516 and through a portion of the wafer substrate.

In the embodiment shown in FIGS. 6-9 integrated circuit die 501 includes columns of tiles including interface tiles 601-604, where each interface tile 601-604 includes at least one row of through die vias 505. In the present embodiment each interface tile 601-604 includes two rows of through die vias 505. In the embodiment shown in FIG. 6, vertical wiring tracks 610 are formed in layer 600 (step 403).

Figure 7:
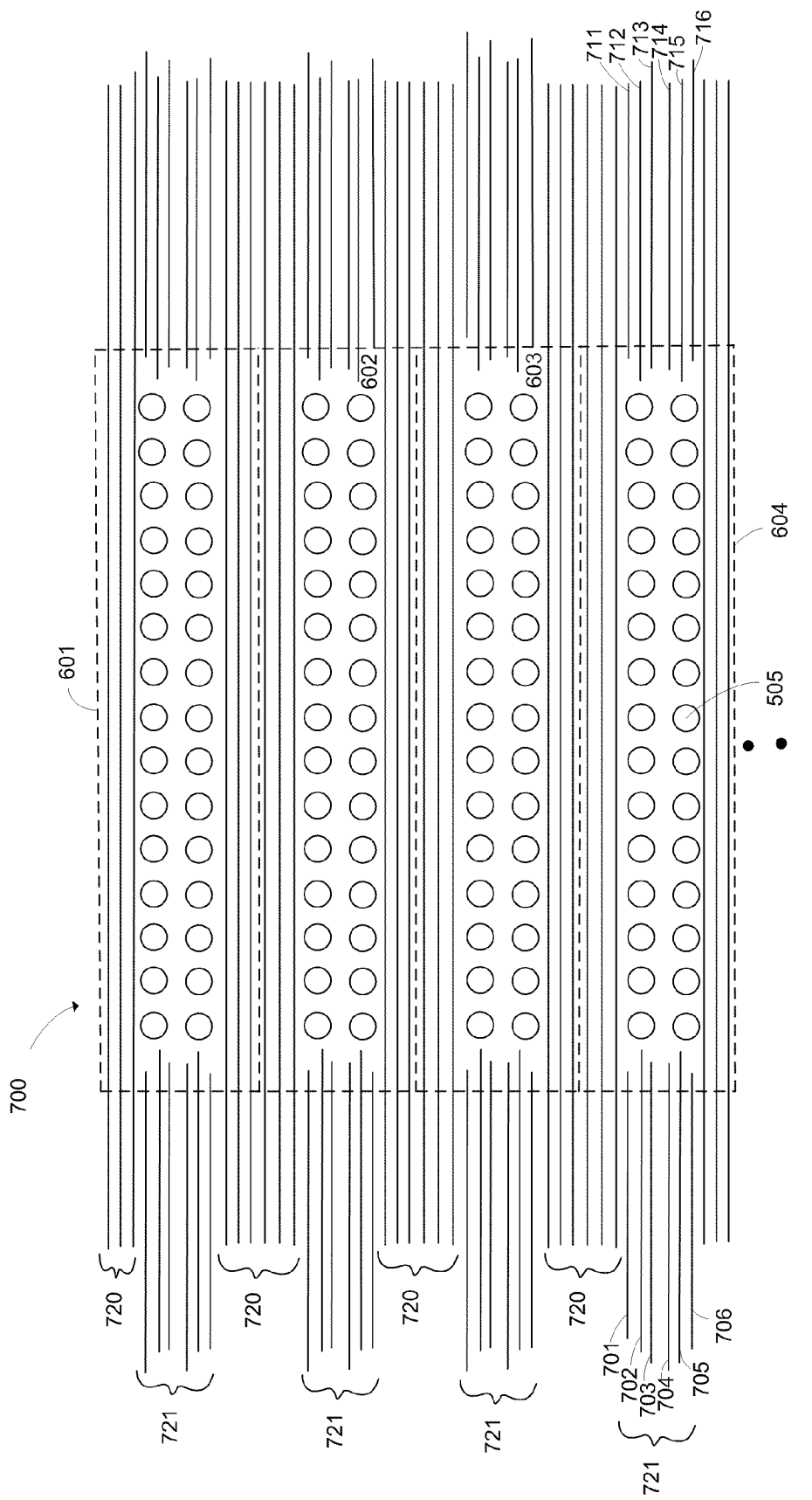
FIG. 7 is a diagram depicting a metal layer that includes horizontal wiring tracks, where some of the horizontal wiring tracks are interrupted by rows of through die vias in accordance with an embodiment of the invention.

Referring now to FIG. 7, horizontal wiring tracks 720-721 are formed in metal layer 700 (step 402). Through die vias 505 interrupt wiring tracks 721, forming wiring segments 701-706 that extend on one side of the rows of through die vias 505 and forming wiring segments 711-716 that extend on the opposite side of the rows of through die vias 505. In the embodiment shown in FIG. 8, step 404 forms horizontal wiring segments 801-806 in a metal layer 800 that includes vertical wiring tracks 610. In the present embodiment each of horizontal wiring segments 801-806 extend between the rows of through die vias 505 in each interface tile 601-604 and a row of through die vias 505 in an adjoining interface tile 601-604. More particularly, a set of horizontal wiring segments 801-806 extends between through die vias 505 in interface tile 601 and the through die vias 505 in interface tile 602.

A second set of horizontal wiring segments 801-806 extends between through die vias 505 in interface tile 602 and through die vias 505 in interface tile 603, and a third set of set of horizontal wiring segments 801-806 extend between through die vias 505 in interface tile 603 and through die vias 505 in interface tile 604.

Figure 8:
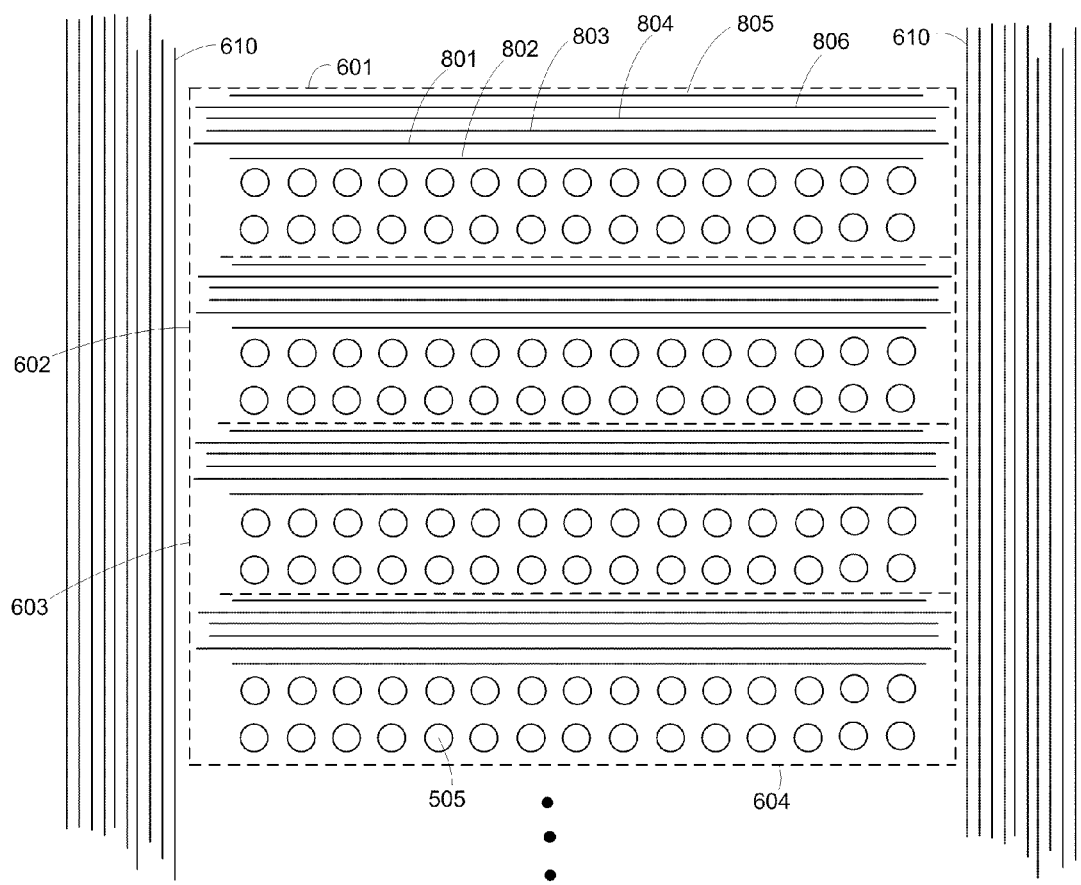
FIG. 8 is a diagram depicting a metal layer that includes the vertical wiring tracks of FIG. 6 after horizontal wiring segments have been formed that extend between rows of through die vias in accordance with an embodiment of the invention.

Continuing with FIG. 8 each of horizontal wiring segments 801-806 are coupled on one end to a wiring segment 701-706 and electrically coupled on the other end to a wiring segment 711-716. More particularly, in the present embodiment horizontal wiring segment 801 is electrically coupled on one end to wiring segment 701 and is electrically coupled on the other end to second wiring segment 711 to electrically couple first wiring segment 701 to wiring segment 711. Each of horizontal wiring segments 802-806 are electrically coupled in a similar manner, with horizontal wiring segment 802 electrically coupling wiring segment 702 to wiring segment 712, horizontal wiring segment 803 electrically coupling wiring segment 703 to wiring segment 713, horizontal wiring segment 804 electrically coupling wiring segment 704 to wiring segment 714, horizontal wiring segment 805 electrically coupling wiring segment 705 to wiring segment 715 and horizontal wiring segment 806 electrically coupling wiring segment 706 to wiring segment 716.

Figure 9:
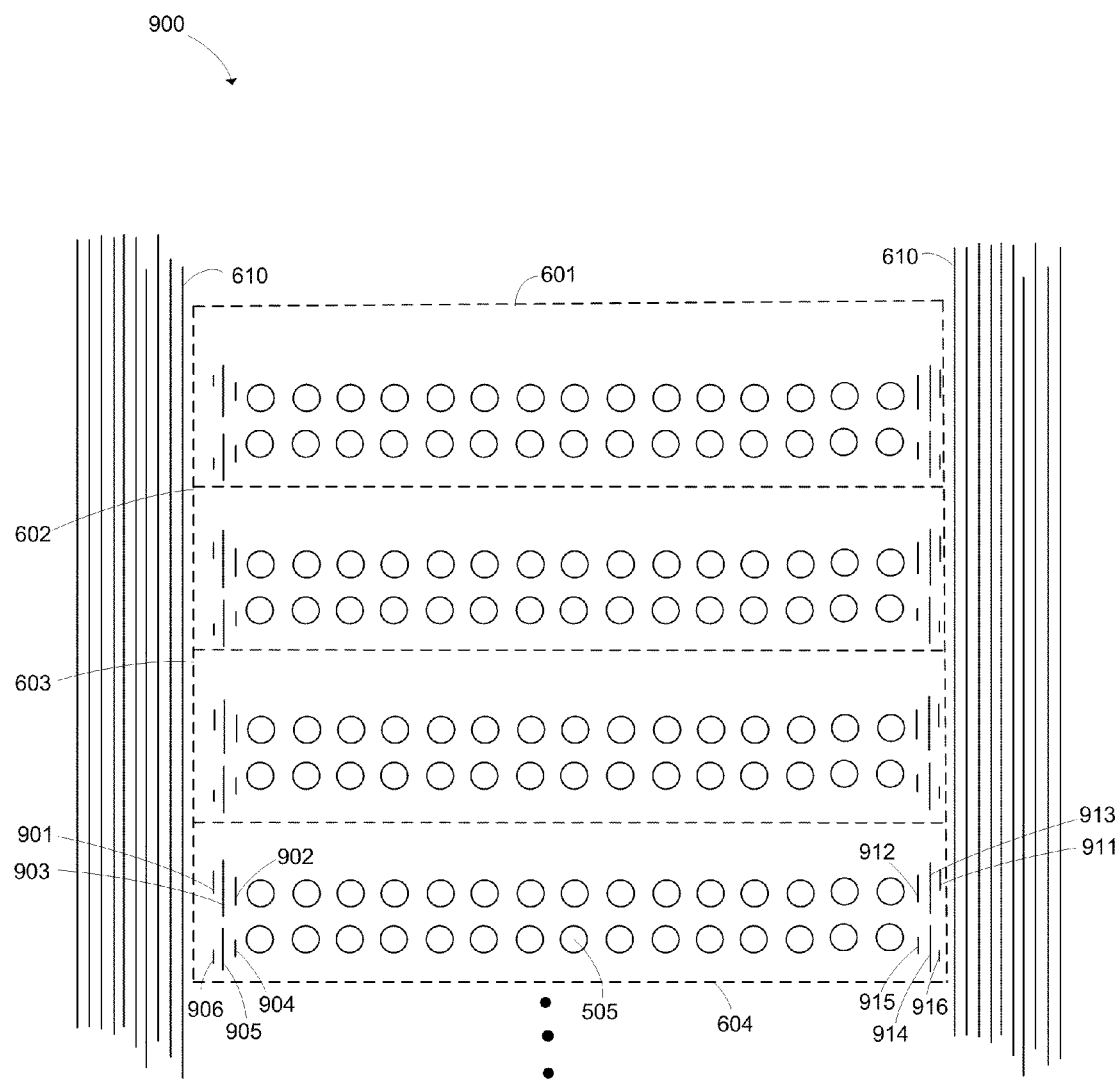
FIG. 9 is a diagram depicting a metal layer that includes vertical wiring tracks that extend on both sides of rows of through die vias and vertical wiring segments that extend on both sides of the rows of through die vias in accordance with an embodiment of the invention.

In the embodiment shown in FIG. 9, a metal layer 900 is shown that includes vertical wiring segments 901-906 and 911-916 that electrically couple horizontal wiring segments 801-806 to wiring segments 701-706 and 711-716. More particularly, vertical wiring segments 901-906 are electrically coupled on one end to a wiring segment 701-716 and electrically coupled on the other end to a horizontal wiring segment 801-806. In the present embodiment vertical wiring segment 901 is electrically coupled on one end to wiring segment 701 and electrically coupled on the other end to the horizontal wiring segment 801. Vertical wiring segments 902-906 are electrically coupled in the same manner, with on one end electrically coupled to a wiring segment 702-706 and the other end electrically coupled to a horizontal wiring segment 802-806. Vertical wiring segments 911-916 are electrically coupled in the same manner, with on one end electrically coupled to a wiring segment 711-716 and the other end electrically coupled to a horizontal wiring segment 801-806.

In the embodiments shown in FIGS. 6-9 horizontal wiring segments 801-806 and vertical wiring segments 901-916 electrically couple wiring segments 701-706 to wiring segments 711-716. In the present embodiment horizontal wiring segments 801-806, vertical wiring segments 901-916, wiring segments 701-716 and the wiring segments of vertical wiring tracks 610 and horizontal wiring tracks 720-721 form a part of the interconnect circuitry of the die that defines routing fabric 214, the routing conductor segments of interface 212 and the circuitry of each interface tile 150 of FPGA integrated circuit device 100. Horizontal wiring segments 801-806, vertical wiring segments 901-916 and wiring segments 701-716 provide added horizontal connectivity across the area of the die occupied by through die vias 505, allowing for greater flexibility in routing signals, power and ground in each metal layer and allowing for effectively interconnecting routing fabric 214, the routing conductor segments of interface 212 and the circuitry of each interface tile 150 to form FPGA integrated circuit device 100.

Figure 10:
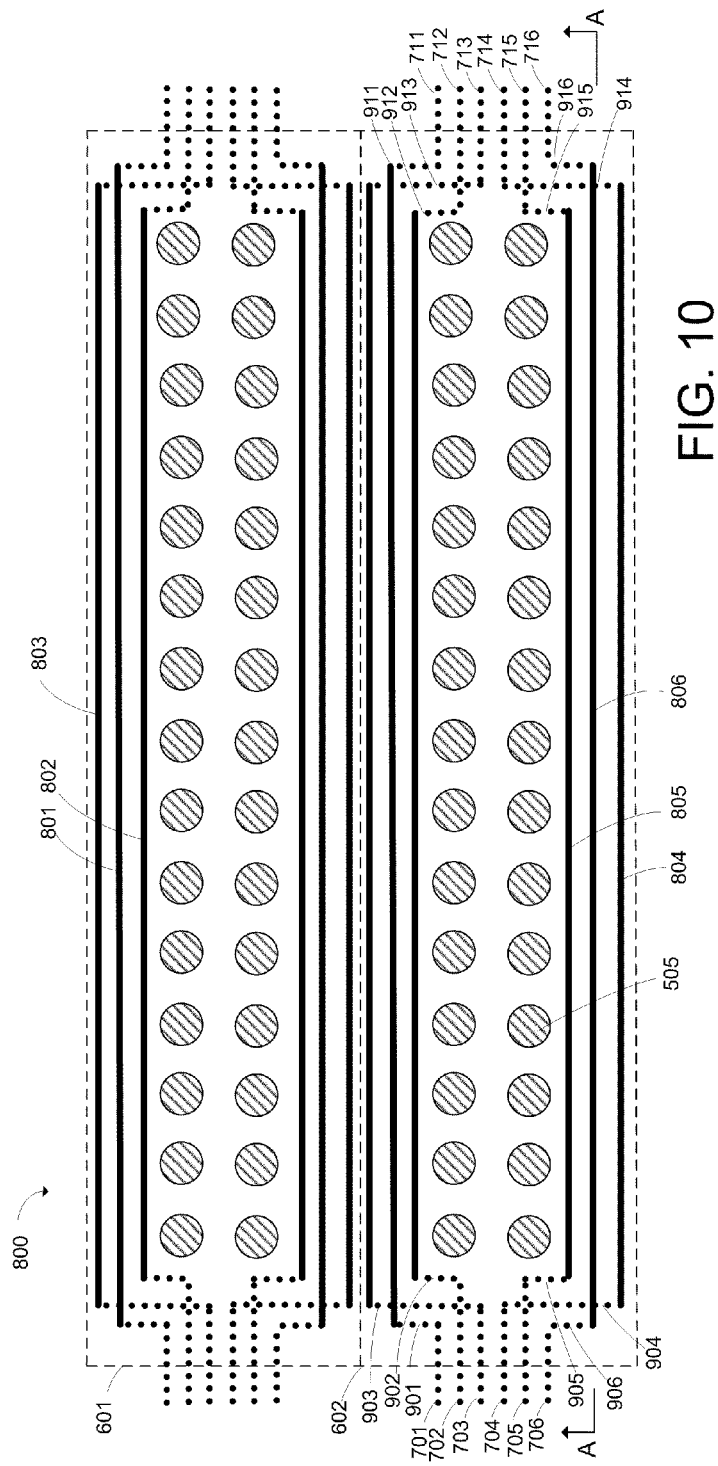
FIG. 10 is a diagram depicting a top view of a metal layer that includes horizontal wiring segments, where wiring segments in horizontal wiring tracks that are interrupted by rows of through die vias and all of the vertical wiring segments that electrically couple to the horizontal wiring segments extend within underlying layers in accordance with an embodiment of the invention.
Figure 11:
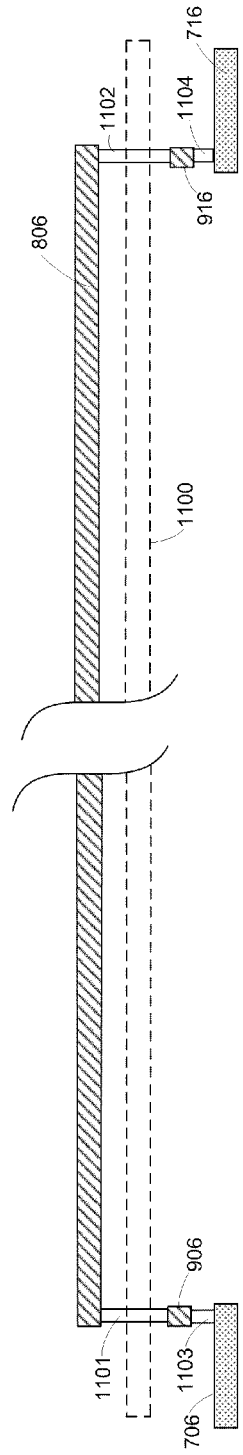
FIG. 11 is a cross-sectional view along section A-A of FIG. 10, that illustrates the horizontal and vertical wiring segments that couple ends of wiring segments in a wiring track that is interrupted by a row of through die vias in accordance with an embodiment of the invention.

In the embodiment shown in FIG. 10 metal layer 800 extends over metal layers 700 and 900. FIG. 11 shows a cross-sectional view of the structure of FIG. 10 along section A-A and illustrates an embodiment in which a layer of horizontal wiring tracks 1100 extends below layer 800, with layer 900 extending below layer 1100 and layer 700 extending below layer 900. In this embodiment vias 1101-1102 extend between vertical wiring segments 901-916 and horizontal wiring segments 801-806 so as to electrically couple vertical wiring segments 901-916 to horizontal wiring segments 801-806. For example, via 1101 connects to one end of horizontal wiring segment 806 and to vertical wiring segment 906 so as to electrically couple horizontal wiring segment 806 to vertical wiring segment 906. Via 1102 connects to the other end of horizontal wiring segment 806 and to vertical wiring segment 916 to electrically couple horizontal wiring segment 806 to vertical wiring segment 916.

Continuing with FIG. 11 vias 1103 extend between each vertical wiring segment 901-906 and corresponding wiring segments 701-706 so as to electrically couple vertical wiring segments 901-906 to wiring segments 701-706. For example, via 1103 connects proximate one end of wiring segment 706 and proximate one end of vertical wiring segment 906 to electrically couple wiring segment 706 to vertical wiring segment 906. Vias 1104 extend between vertical wiring segments 911-916 and corresponding wiring segments 711-716 so as to electrically couple vertical wiring segments 911-916 to wiring segments 711-716. For example, via 1104 connects proximate one end of wiring segment 716 and proximate one end of vertical wiring segment 916 to electrically couple wiring segment 716 to vertical wiring segment 916.

Figure 5:
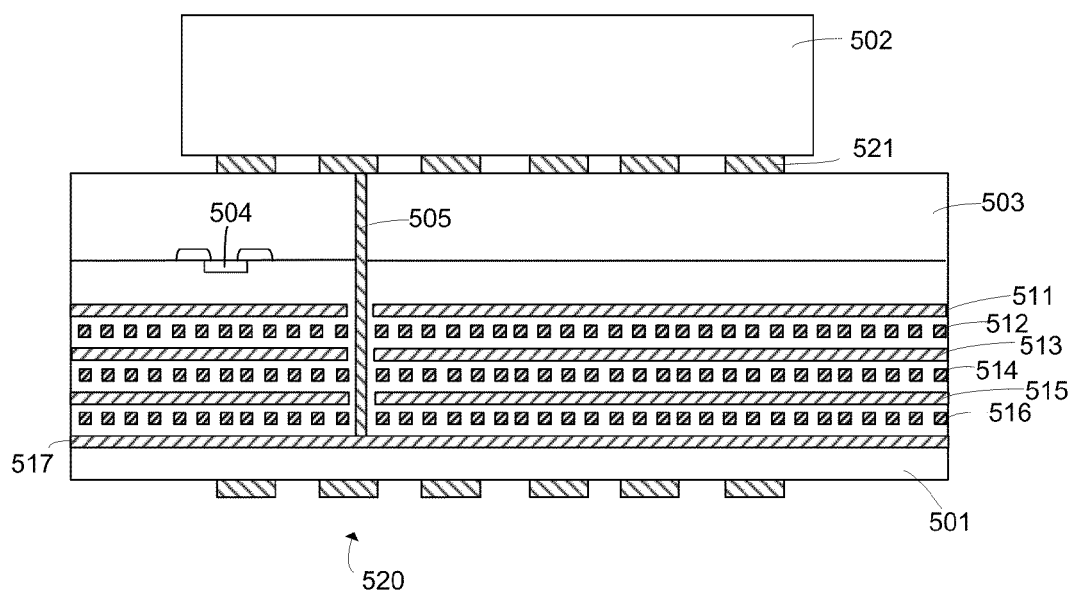
FIG. 5 is a cross-sectional view showing an exemplary embodiment of a semiconductor device that includes a second die that attaches to a backside of a FPGA die in accordance with an embodiment of the invention.
Figure 6:
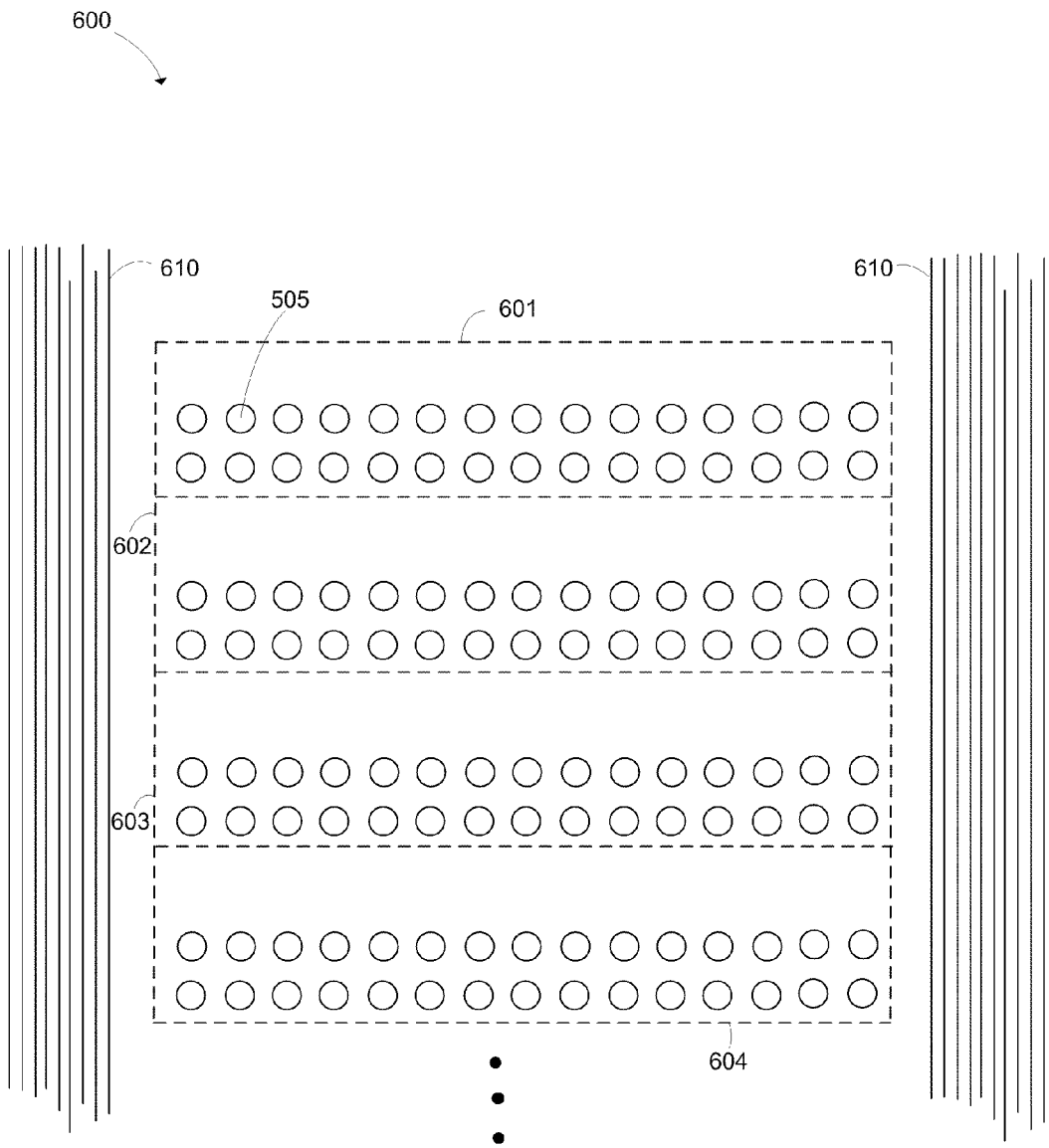
FIG. 6 is a top view of a face-side of a semiconductor die that shows a metal layer having vertical wiring tracks that extend on both sides of rows of through die vias in accordance with an embodiment of the invention.

In one specific embodiment layer 800 corresponds to layer 516, layer 1100 corresponds to layer 515, layer 900 corresponds to layer 514 and layer 700 corresponds to layer 513 of FIG. 5. However, alternatively some or all of the structures shown in FIGS. 10-11 could be on other layers of integrated circuit die 501.

Referring back to FIG. 4, an additional metal layer is formed as shown by step 407. Referring now to FIG. 5, an additional metal layer 517 is formed that connects to one end of each through die via 505. Metal layers 511-516 extend between additional metal layer 517 and substrate 503 and are electrically coupled to additional metal layer 517. Additional metal layer 517 can be formed by depositing, masking and etching a metal layer that contacts each through die via 505. Since through die vias are formed in the wafer after devices and metal layers 511-516, only metal layer 517 will directly contact each through die via 505.

As shown in step 408 contacts are formed on the face side of the die. In the embodiment shown in FIG. 5 a grid array of contacts 520 are formed on the face side of integrated circuit die 501 that are suitable for coupling integrated circuit die 501 to external circuitry using a ball grid array. Vias and contacts (not shown) electrically couple each device 504 to metal layers 511-517 and contacts 520.

As shown by step 409, contacts are formed on the backside of the die. In the embodiment shown in FIG. 5, contacts 521 are formed on the backside of integrated circuit die 501. In the present embodiment contacts 521 are formed by grinding the backside of the wafer to reduce the thickness of semiconductor substrate 503 and expose each via 505, followed by metal deposition and patterning steps in which a metal layer is deposited over the backside of the wafer and patterned to form contacts 521. In the present embodiment contacts 521 are formed over one end of each of through die vias 505 so as to electrically couple individual contacts 521 to individual through die vias 505.

In the embodiment shown in FIG. 5, steps 401-409 form a complete integrated circuit die 501. In the present embodiment steps 401-409 form a complete field programmable gate array integrated circuit device 100 shown in FIGS. 1-2. Other die, such as second die 502, are then electrically and mechanically coupled to contacts 521 as shown by step 410. Contacts 521 electrically couple second die 502 to the circuitry of integrated circuit die 501, forming a complete FPGA integrated circuit device 500. The second die 502 may comprise any type of digital, analog, or mixed-signal integrated circuit device. Each of the die 502 and 501 is configured for face-down mounting in flip-chip fashion. The term "face side" denotes the side of a die that receives the bulk of semiconductor processing such that circuitry is fabricated on that face side of the die. The side of a die opposite the face side is referred to as the backside of the die. Thus, the face side of second die 502 is mounted to the backside of integrated circuit die 501.

FIGS. 12-20 illustrate various different embodiments in accordance with aspects of the present invention. It is pointed out that these embodiments are exemplary and that each horizontal wiring segment that couples together a wiring segment that is interrupted by a row of through die vas can be coupled in different overlying or underlying layers. Moreover, some layers that include vertical wiring tracks can include more or fewer horizontal wiring segments than other layers.

Figure 12:
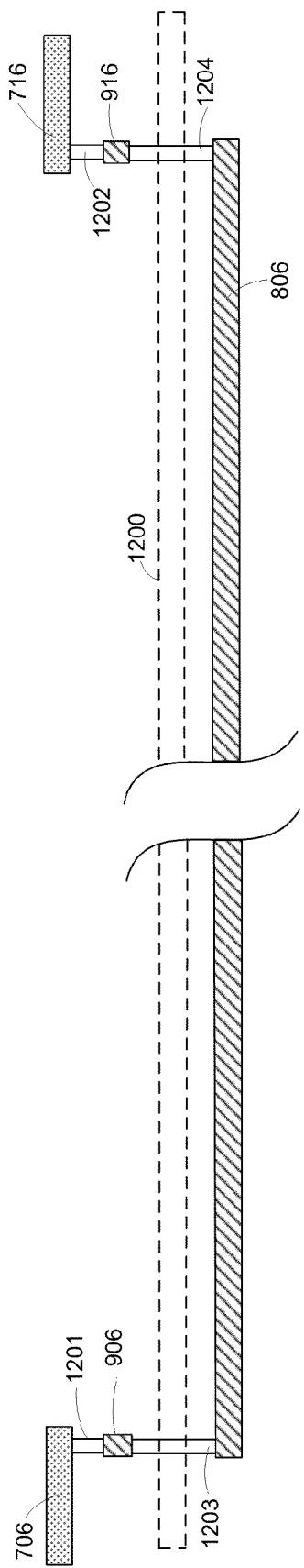
FIG. 12 is a cross-sectional view that illustrates the horizontal and vertical wiring segments that couple ends of wiring segments in a wiring track that is interrupted by a row of through die vias, where the vertical wiring segments and the wiring segments in the horizontal wiring track that is interrupted by the row of through die vias extend over the horizontal wiring segment that they electrically connect to in accordance with an embodiment of the invention.

Referring now to FIG. 12, an embodiment is shown in which layers 900 and 700 extend above layer 800, with an overlying horizontal metal layer 1200 extending between layer 800 and layer 900. Vias 1201-1202 extend between vertical wiring segments 906-916 and corresponding wiring segments 706-716 so as to electrically couple vertical wiring segments 906-916 to wiring segments 706-716. For example, a via 1201 connects proximate one end of each wiring segment 706 and proximate one end of vertical wiring segment 906 to electrically couple wiring segment 706 to vertical wiring segment 906. A via 1202 extends between each vertical wiring segments 911-916 and a corresponding wiring segments 711-716 so as to electrically couple vertical wiring segments 911-916 to wiring segments 711-716. For example, via 1202 connects proximate one end of wiring segment 716 and proximate one end of vertical wiring segment 916 to electrically couple wiring segment 716 to vertical wiring segment 916.

Continuing with FIG. 12, vias 1203-1204 extend between vertical wiring segments 901-916 and horizontal wiring segments 801-806 so as to electrically couple vertical wiring segments 901-916 to horizontal wiring segments 801-806. For example, via 1203 connects to one end of horizontal wiring segment 806 and to vertical wiring segment 906 so as to electrically couple horizontal wiring segment 806 to vertical wiring segment 906. Via 1204 connects to the other end of horizontal wiring segment 806 and to vertical wiring segment 916 to electrically couple horizontal wiring segment 806 to vertical wiring segment 916.

Figure 13:
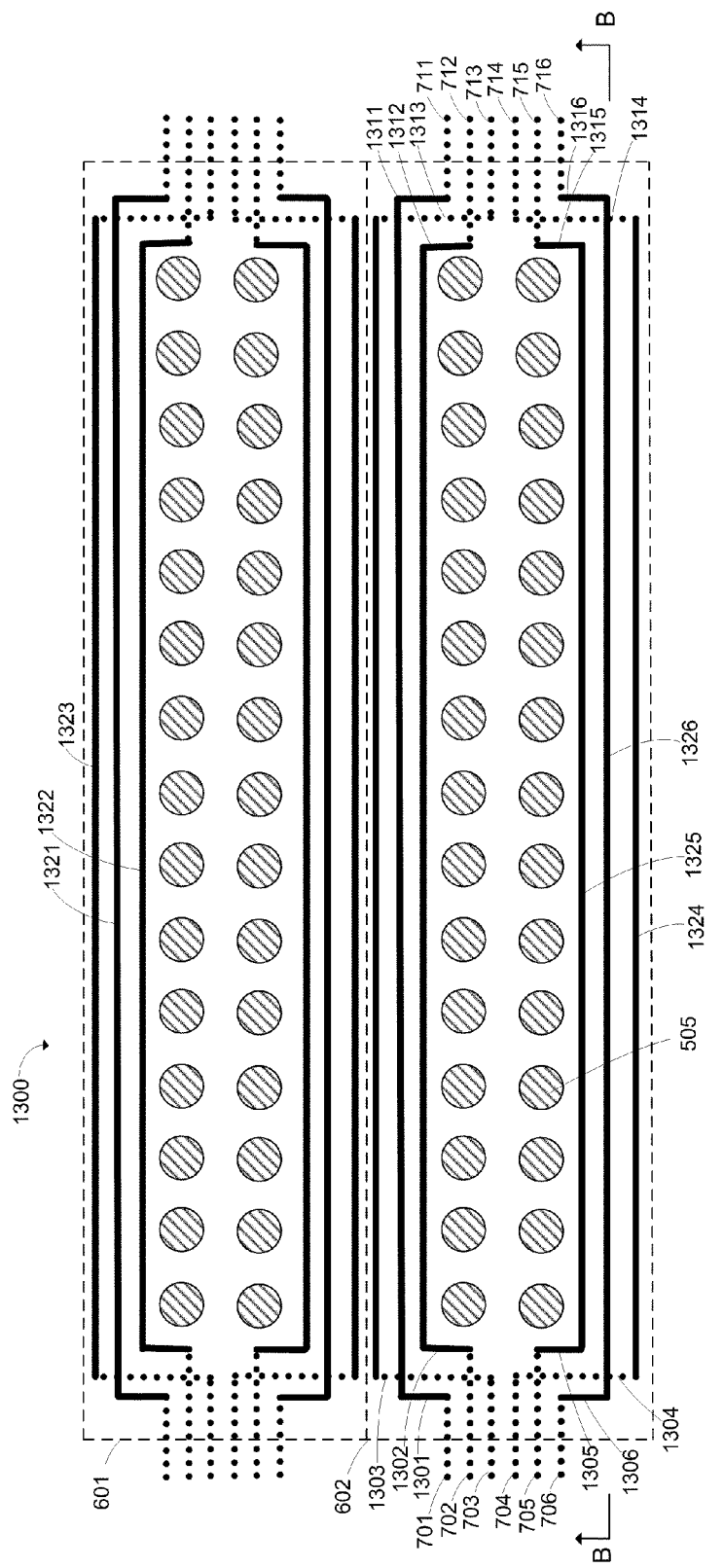
FIG. 13 is a top view of a metal layer that includes horizontal wiring segments and vertical wiring segments, where the wiring segments in horizontal wiring tracks that are interrupted by rows of through die vias extend within underlying layers and wherein some of the vertical wiring segments extend within underlying layers in accordance with an embodiment of the invention.
Figure 14:
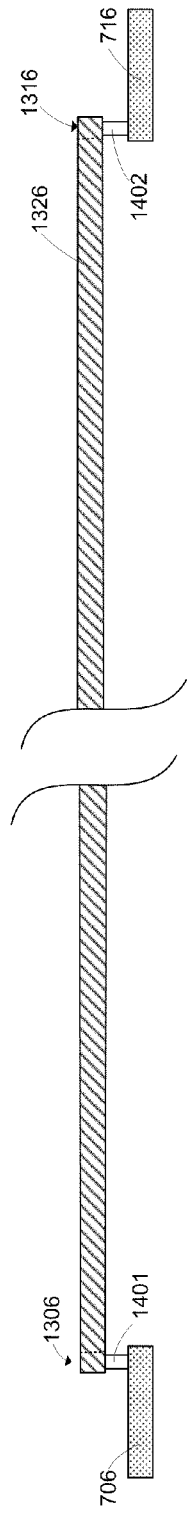
FIG. 14 is a cross-sectional view along section B-B of FIG. 13, that illustrates the horizontal and vertical wiring segments that couple wiring segments in a wiring track that is interrupted by a row of through die vias in accordance with an embodiment of the invention.

One or more of the horizontal wiring segments can be on the same metal layer as vertical wiring segments. In one embodiment that is illustrated in FIG. 13, a metal layer 1300 is shown that includes vertical wiring segments 1301-1302, 1305-1306, 1311-1312 and 1315-1316 that are on the same layer as horizontal wiring segments 1321-1326. The other horizontal wiring segments 1303, 1304, 1313 and 1314 are located on underlying layers. In the embodiment shown in FIG. 14, wiring segments 701-706 and 711-716 of FIG. 13 extend on a layer 700 that is immediately below layer 1300. In this embodiment vias 1401-1402 couple vertical wiring segments 1301-1302, 1305-1306, 1311-1312 and 1315-1316 to wiring segments 701-706 and 711-716.

In an exemplary embodiment that is shown in FIG. 15, the layout is the same as shown in FIG. 13 except that some of wiring segments 701-706 and 711-716 extend on a layer 700 that is immediately above layer 1300. In this embodiment vias 1501-1502 are shown to couple vertical wiring segments 1306 and 1316 to wiring segments 706 and 716.

In some embodiments, some of wiring segments 706-716 that are coupled together extend on one layer and others that are coupled together extend on a different layer. In an exemplary embodiment that is shown in FIG. 16, some of the horizontal and vertical wiring segments are coupled in the manner shown in FIGS. 13-14 and some of vertical wiring segments 1303, 1304, 1313 and 1314 are coupled together in layers that extend under a layer 1600 that includes horizontal wiring tracks. Vias 1601-1602 electrically couple vertical segments 1304 and 1314 to horizontal wiring segment 1324 and vias 1603-1604 electrically couple vertical wiring segments 1304 and 1314 to wiring segments 704 and 714.

Figure 17:
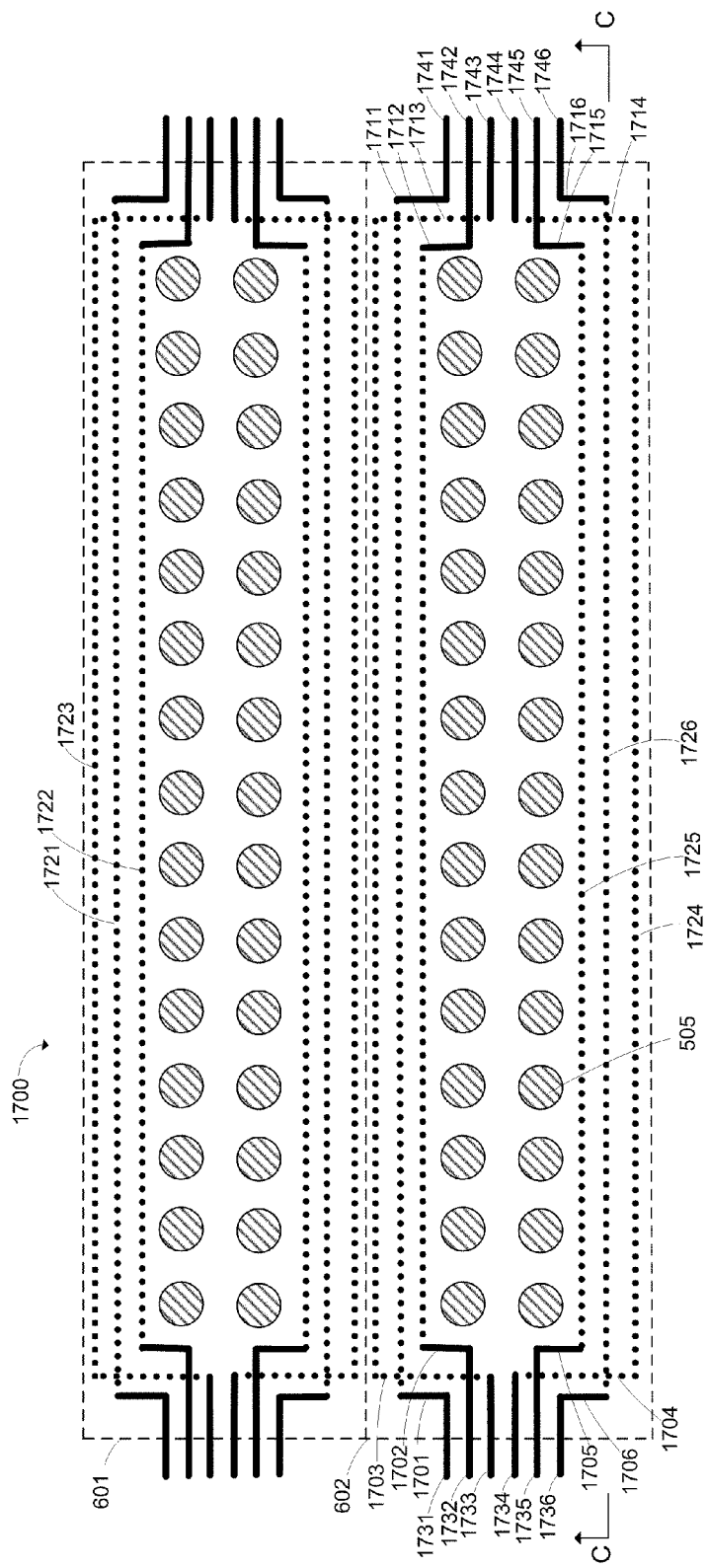
FIG. 17 is a top view of a metal layer that includes wiring segments in horizontal wiring tracks that are interrupted by rows of through die vias wherein horizontal wiring segments extend within underlying layers and some vertical wiring segments extend within underlying layers in accordance with an embodiment of the invention.

In yet another embodiment that is shown in FIG. 17, at least some of the wiring segments on horizontal wiring tracks that are interrupted by through die vias are on the same layer as the vertical wiring segments that they connect to. More particularly, layer 1700 includes wiring segments 1731-1736, with wiring segments 1731, 1732, 1735 and 1736 connecting to a vertical wiring segment on the same layer 1700. In addition, layer 1700 includes wiring segments 1741-1746, with wiring segments 1741, 1742, 1745 and 1746 connecting to a corresponding vertical wiring segment 1711-1712 and 1715-1716 on layer 1700. In this embodiment horizontal wiring segments 1721-1726 are on underlying layers.

Figure 18:
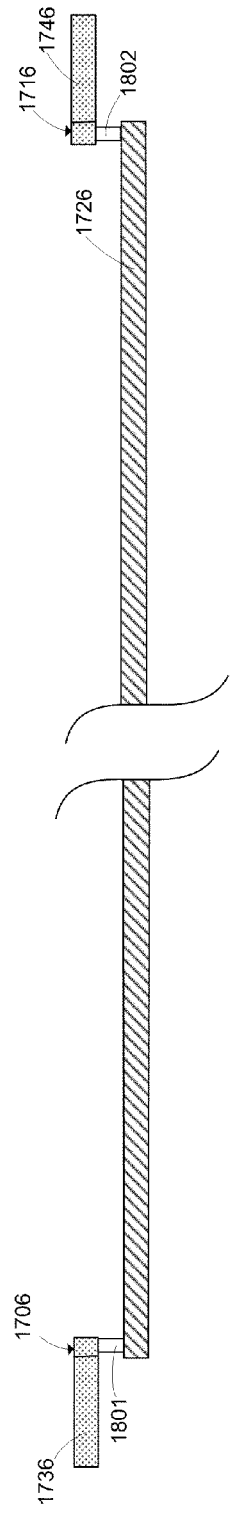
FIG. 18 is a cross-sectional view along section C-C of FIG. 17, that illustrates the horizontal and vertical wiring segments that couple wiring segments in a wiring track that is interrupted by a row of through die vias in accordance with an embodiment of the invention.

In the embodiment shown in FIG. 18, at least some of horizontal wiring segments 1721-1726 extend on the metal layer that extends immediately below layer 1700. In this embodiment an exemplary horizontal wiring segment 1726 is shown that is electrically coupled on one end to vertical wiring segment 1736 by via 1801 and is electrically coupled on the other end to a vertical wiring segment 1746 by via 1802.

In yet another embodiment one or more of the horizontal wiring segments 1721-1726 shown in FIG. 17 can extend above layer 1700 as shown in FIG. 19. In the embodiment shown in FIG. 19, vias 1901-1902 electrically couple horizontal wiring segment 1726 to vertical wiring segments 1706 and 1716.

In the embodiment shown in FIG. 20, vertical wiring segment 1704 and 1714 extend in a metal layer that underlies layer 1700. A layer 1900 that includes horizontal wiring tracks extends below wiring segments 1734 and 1744 and above the layer that includes horizontal wiring segment 1724. Vias 1901-1904 couple wiring tracks 1734 and 1744 to vertical wiring segments 1704 and 1714 and to horizontal wiring segment 1724.

Though the embodiments shown in FIGS. 5-20 show the use of vertical wiring segments it is appreciated that the wiring segments that electrically couple a horizontal wiring segments to segments of a horizontal wiring track that is interrupted by a row of through die vias may not be oriented vertically. In some embodiments they have some other orientation (not vertical) or they can be nonlinear Moreover, though the embodiments shown in FIGS. 5-20 show the use of horizontal and vertical wiring tracks it is appreciated that the wiring tracks can have different orientations. In one embodiment the wiring tracks have orientations that are not horizontal and vertical. In one specific embodiment the wiring tracks are orthogonal to each other, with all of the wiring tracks in a first set of wiring tracks extending approximately in a first direction and all of the wiring tracks in a second set of wiring tracks extend approximately in a second direction that is perpendicular to the first direction. In this embodiment, with the exception of the first set of wiring segments, all wiring on the metal layer that includes the second set of wiring tracks of metal layers extend in the second direction.

Figure 21:
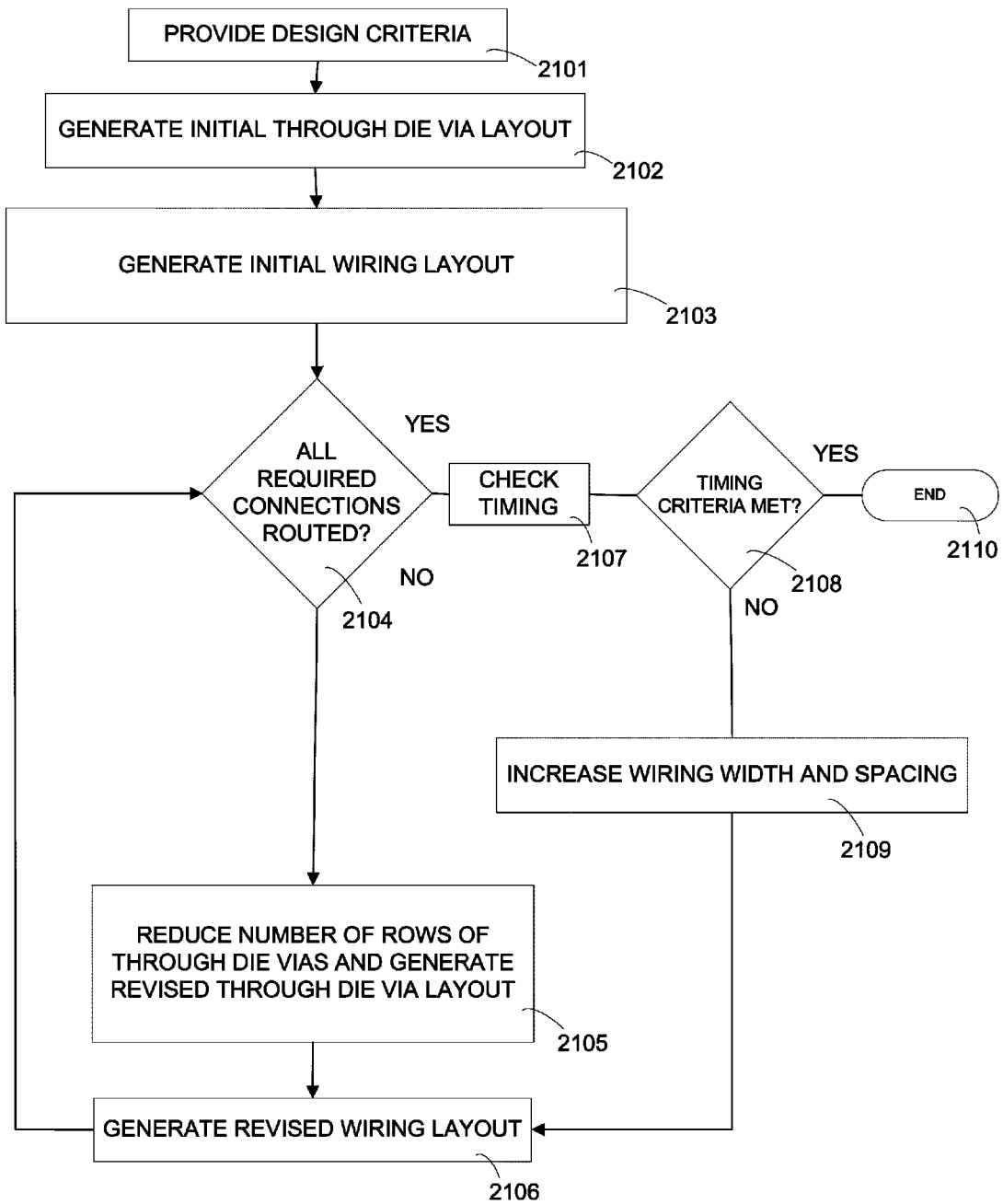
FIG. 21 is a block diagram depicting a method for forming a layout of an integrated circuit device in accordance with an embodiment of the invention.

In the present embodiment steps 401-409 of FIG. 4 include generating a layout in electronic form that defines the layers of the integrated circuit design. In one embodiment the integrated circuit design for the structures formed in steps 402-406, are generated using an automated process that is illustrated in FIG. 21.

Referring now to step 2101 design criteria are provided. In the present embodiment design criteria are entered into a computer and are stored in a data storage device of the computer. Design criteria include the minimum through-die via spacing (the minimum distance between adjacent through die vias) $TDVS_{MIN}$, the number of through die vias (TDVN) and the initial number or rows of through die vias ($TDVR_I$), the minimum spacing between wiring tracks ($WS_{MIN}$) and the minimum width of wiring segments ($WW_{MIN}$). In addition other criteria could be entered such as the number of connections to be routed, etc. Other criteria required for routing, such as initial column width and data relating to devices and features of the FPGA device being designed can be imported from a netlist or from an initial layout that defines the basic features of the design. This initial layout can be generated by uploading one or more netlist into a hierarchical data file and/or by use of a layout editor to generate the hierarchal data file.

As shown by step 2102 an initial through die via layout is generated. In the present embodiment the initial through die via layout specifies the placement of through die vias in each of the layers of the design though which the through die vias pass. In the embodiment shown in FIG. 5, the initial through die via layout includes the placement of through die vias 505 in each of layers 511-516 and in each device layer. The placement of through die vias in step 2102 conforms to the design criteria provided in step 2101. More particularly, in the initial through die via layout, the number of through die vias is equal to TDVN provided in step 2101, the number of rows of through die vias (TDVR) is $TDVR_I$ provided in step 2101, and the spacing between adjacent through die vias (TDVS) is equal to $TDVS_{MIN}$ provided in step 2101.

As shown by step 2103 an initial wiring layout is generated. In the present embodiment the initial wiring layout defines the wiring of steps 402-405 of FIG. 4. For example, in the embodiment shown in FIG. 5, the initial wiring layout will define the layout of layers 511-516 and will include wiring segments that extend within horizontal and vertical wiring tracks and the horizontal and vertical wiring segments of steps 404-405. The initial wiring layout of step 2103 defines the layout of each of the metal layers through which through die vias pass. In the present embodiment the width of wiring segments (WW) in the initial wiring layout is equal to the $WW_{MIN}$ provided in step 2101 and the spacing between wiring tracks (WS) is equal to $WS_{MIN}$ provided in step 2101.

The initial wiring layout is then tested as shown by step 2104 to determine whether all required connections have been routed (100% routability). If the initial wiring layout does not route all required connections (less than 100% routability), the number or rows of through die vias is reduced as shown by step 2105 and a revised through die via layout is generated. In the present embodiment the revised through die via layout will conform to all of the design criteria provided in step 2101 except that it will include a number of rows of through die vias (TDVR) that is less than $TDVR_I$. Also, in the revised through die via layout, the number of through die vias is equal to TDVN.

Referring now to step 2106 a revised wiring layout is generated that corresponds to the revised through die via layout of step 2105. The revised wiring layout defines the wiring of steps 402-405 of FIG. 4 while routing around the through die vias in the revised through die via layout of step 2105. For example, in the embodiment shown in FIG. 5, the revised wiring layout will define the layout of layers 511-516 and will include wiring segments that extend within horizontal and vertical wiring tracks and the horizontal and vertical wiring segments of steps 404-405. The revised wiring layout of step 2106 defines the layout of each of the metal layers through which through die vias pass. In the revised wiring layout, $WW=WW_{MIN}$ and $WS=WS_{MIN}$.

The initial wiring layout is again tested as shown by step 2104 to determine whether all required connections have been routed (100% routability). The revised wiring layout generated in step 2106 will have an increased number of connections routed as a result of the reduction in the number of rows of through die vias in step 2105. However, if the revised wiring layout does not route all of the required connections the process is repeated as shown by steps 2104-2106 until all required connections have been routed. More particularly, the number of rows of through die vias is reduced and revised through die via layouts are generated (step 2105), and corresponding revised wiring layouts are generated (step 2106) and tested (step 2104) until a revised through die via layout and revised wiring layout are obtained that route all required connections.

In the present embodiment, in each subsequent iteration of step 2105 the number of rows of through die vias is reduced by one or more row. Thereby, the spacing between adjoining sets of rows of through die vias is increased, allowing for an increased number of uninterrupted horizontal wiring segments. This can be accomplished, for example by increasing the number of through die vias in each row. By starting with a $TDVR_I$ that includes a relatively high number or rows and reducing the number of rows until full routability is achieved, the resulting layout will minimize the area overhead of the through die vias while achieving 100% routability.

Referring now to step 2107, when step 2104 indicates that all required connections have been routed the timing is checked. More particularly, the timing of some or all of the wiring segments routed in steps 2106 are checked to determine whether they meet timing criteria. In the present embodiment maximum timing values are provided in step 2101, and a test algorithm is run on the design to determine how long it takes the signals to be routed. If the timing check of step 2107 indicates that the timing criteria are not met in step 2108 the method proceeds to step 2109.

As shown by step 2109 wiring width is increased. In one embodiment a wiring width increase value (WWI) is provided in step 2101 that specifies the amount by which the wiring width is to be increased each time that step 2109 is performed. In one embodiment the increased wiring width (WW) is determined by adding the WWI to the $WW_{MIN}$ provided in step 2101. Alternatively, the revised wiring width can be determined by multiplying WWI by $WW_{MIN}$.

In the present embodiment the wiring spacing is also increased. In this embodiment the amount of the increase in wiring spacing is determined using a wiring spacing increase (WSI) value that is provided in step 2101. The revised wiring spacing WS can be determined either by adding WSI to $WS_{MIN}$ or by multiplying $WS_{MIN}$ by WSI.

A revised wiring layout is then generated as shown by step 2106 that uses the revised wiring width and the revised wiring spacing from step 2109. In the present embodiment the revised wiring layout is generated using the reduced number of rows of through die vias in the latest revised through die via layout of step 2105 and includes wiring segments having the revised wiring width and the revised wiring spacing from step 2109.

Steps 2104-2106 are repeated, using the revised wiring width and the revised wiring spacing while incrementally reducing the number of rows of through die vias until the wiring layout again routes all required connections. In addition, steps 2107-2109 are repeated, incrementally increasing wiring width and spacing until all required connections are routed in step 2104 and timing criteria are met in step 2108, at which time the automated process ends as shown by step 2110.

Once the automated process of steps 2102-2110 ends, the latest through die via layout and revised wiring layout are entered into the integrated circuit design layout. The design process then continues with the design of the additional metal layer of step 407, with the design of the additional layer of step 407 and the remainder of the integrated circuit device performed in a conventional manner. However, the process of reducing the number of rows of through die vias in step 2105 will increase the width of each column of interface tiles. Accordingly, it may be desirable to revise the layout of the device layers to take into account the revised through die via layout.

In one embodiment an automated program, that can be referred to hereinafter as a "through-die-via/interconnect placement (TDVIP) program," performs some or all of the steps of method 2100, where the TDVIP program is a computer program operable on one or more computer. The TDVIP program allows for entry of design criteria provided in step 2101 and interfacing with device layers of the layout and/or netlists that define features of the integrated circuit device design, automatically importing data required for performing method 2100 when such data is available in an electronic form accessible to the TDVIP program. In one embodiment an initial integrated circuit design layout is generated in hierarchal form that defines the device layers for features of the integrated circuit design other than the features contained within interface tiles. This initial design includes spaced reserved for the interface tiles and includes, at a minimum a basic floorplan of the integrated circuit design. The TDVIP is then operable to perform method steps 2102-2109 in an automated fashion and without user input until an integrated circuit design layout is obtained that routes all required connections and meets timing criteria.

While the foregoing describes exemplary embodiment(s) in accordance with one or more aspects of the present invention, other and further embodiment(s) in accordance with the one or more aspects of the present invention may be devised without departing from the scope thereof, which is determined by the claim(s) that follow and equivalents thereof. Claim(s) listing steps do not imply any order of the steps. Trademarks are the property of their respective owners.

What is claimed is:

1. A method for coupling wiring of an integrated circuit device comprising:
   forming devices on a semiconductor substrate;
   forming a first plurality of metal layers that substantially comprise horizontal wiring tracks, the first plurality of metal layers electrically coupled to the devices;
   forming a second plurality of metal layers that substantially comprise vertical wiring tracks, the second plurality of metal layers electrically coupled to the devices;
   forming rows of through die vias that extend through the first plurality of metal layers and the second plurality of metal layers, the rows of through die vias including at least one row of through die vias that extends within an interface tile, the at least one row of through die vias interrupting a first wiring track on the first plurality of metal layers, the first wiring track including a first wiring segment that extends on one side of the at least one row of through die vias and including a second wiring segment that extends on the opposite side of the at least one row of through die vias; and forming horizontal wiring segments in the second plurality of metal layers, the horizontal wiring segments including a first horizontal wiring segment that is electrically coupled on one end to the first wiring segment and that is electrically coupled on the other end to the second wiring segment so as to electrically couple the first wiring segment to the second wiring segment.

2. The method of claim 1 wherein the first horizontal wiring segment extends between the plurality of rows of through die vias and a row of through die vias in an adjoining interface tile.

3. The method of claim 2 further comprising:

forming a plurality of vertical wiring segments including a first vertical wiring segment and a second vertical wiring segment, the first vertical wiring segment electrically coupled on one end to the first wiring segment and electrically coupled on the other end to the first horizontal wiring segment, the second vertical wiring segment electrically coupled on one end to the second wiring segment and electrically coupled on the other end to the first horizontal wiring segment.

4. The method of claim 3 further comprising forming a first plurality of vias that extend between individual of the plurality of vertical wiring segments and individual of the plurality of horizontal wiring segments.

5. The method of claim 4 further comprising forming a second plurality of vias that include a third via and a fourth via, the third via extending between the first wiring segment and the first vertical wiring segment and the fourth via extending between the second wiring segment and the second vertical wiring segment.

6. The method of claim 3 further comprising:

forming an additional metal layer that connects to the at least one row of through die vias, the first plurality of metal layers and the second plurality of metal layers extending between the additional metal layer and the substrate of the integrated circuit die; and forming contacts on the backside of the integrated circuit die that are electrically coupled to the at least one row of through die vias.

7. The method of claim 1 further comprising:

generating through die via layouts and corresponding wiring layouts, with each subsequent through die via layout having a reduced number of rows of through die vias, until a wiring layout is generated that routes all required connections;

increasing wiring width and spacing of each wiring layout that routes all required connections and that does not meet timing criteria; and continuing the generating through die via layouts and corresponding wiring layouts, and the increasing wiring width and spacing until a wiring layout is obtained that routes all required connections and that meets the timing criteria.

8. An integrated circuit die having an array of tiles arranged in columns, comprising:

an interface tile that includes at least one row of through die vias;

a first plurality of metal layers that include horizontal wiring tracks; and a second plurality of metal layers that include vertical wiring tracks, at least some of the second plurality of metal layers including horizontal wiring segments, each horizontal wiring segment coupling to a first wiring segment of a horizontal wiring track that is interrupted by the at least one row of through die vias and coupling to a second wiring segment of the horizontal wiring track that is interrupted by the at least one row of through die vias, each horizontal wiring segment extending between the at least one row of through die vias and at least one row of through die vias in an adjoining interface tile.

9. The integrated circuit die of claim 8, further comprising an additional metal layer that electrically connects to the at least one row of through die vias, wherein the at least one row of through die vias, the first plurality of metal layers and the second plurality of metal layers extend between the additional metal layer and the backside of the integrated circuit die, wherein the at least one row of through die vias extend through each of the metal layers in the first plurality of metal layers and the second plurality of metal layers.

10. The integrated circuit die of claim 9 further comprising a plurality of vertical wiring segments, the plurality of vertical wiring segments including a first vertical wiring segment and a second vertical wiring segment, the first vertical wiring segment electrically coupled on one end to one of the horizontal wiring segments and electrically coupled on the other end to the first wiring segment of a horizontal wiring track that is interrupted by the at least one row of through die vias, the second vertical wiring segment electrically coupled on one end to one of the horizontal wiring segments and electrically coupled on the other end to the second wiring segment of a horizontal wiring track that is interrupted by the at least one row of through die vias.

11. The integrated circuit die of claim 8, wherein the first wiring segment of the horizontal wiring track that is interrupted by a through die via, the second wiring segment of the horizontal wiring track that is interrupted by a through die via and the horizontal wiring segments form a part of a routing fabric of a field programmable gate array integrated circuit device, and wherein the interface tile comprises contacts on a backside of the integrated circuit die, the at least one row of through die vias electrically coupled to the contacts.

12. The integrated circuit die of claim 11 wherein the interface tile comprises:

at least one programmable interconnect element coupled to the routing fabric;

a configurable logic element;

a first interface circuit coupled to a first plurality of the through die vias;

a second interface circuit coupled to a second plurality of the through die vias; and selection logic for selectively coupling first signals from the at least one programmable interconnect element to either the configurable logic element or the first interface circuit, and second signals to the at least one programmable interconnect element from either the configurable logic element or the second interface circuit.

13. The integrated circuit die of claim 9, wherein, with the exception of the horizontal wiring segments, all wiring on the second plurality of metal layers extends vertically.

14. The integrated circuit die of claim 9, wherein, with the exception of the horizontal wiring segments, none of the wiring on the second plurality of metal layers extends horizontally.

15. The integrated circuit die of claim 9, wherein at least some of the vertical wiring segments extend within the first plurality of metal layers, and further wherein, with the exception of the vertical wiring segments, none of the wiring on the first plurality of metal layers extends vertically.

16. The integrated circuit die of claim 9, wherein at least some of the vertical wiring segments extend within the first plurality of metal layers, and further wherein, with the exception of the vertical wiring segments, all of the wiring on the first plurality of metal layers extends horizontally.

17. A device having an array of tiles arranged in columns, comprising:
- an interface tile on a first integrated circuit die, the interface tile including at least one row of through die vias that are coupled to contacts attached to a backside of the first integrated circuit die and including a logic element coupled to a routing fabric of the first integrated circuit die;
- a first plurality of metal layers on the first integrated circuit die, each of the first plurality of metal layers including a first plurality of wiring tracks that are oriented in a first direction;
- a second plurality of metal layers on the first integrated circuit die, each of the second plurality of metal layers including a second plurality of wiring tracks that are oriented approximately orthogonally to the first direction, at least some of the second plurality of metal layers including first wiring segments, each first wiring segment coupling to a first wiring segment of a wiring track in the first plurality of wiring tracks that is interrupted by the at least one row of through die vias and coupling to a second wiring segment of the wiring track in the first plurality of wiring tracks that is interrupted by the at least one row of through die vias, each first wiring segment extending between the at least one row of through die vias and at least one row of through die vias in an adjoining interface tile; and
- second wiring segments on the first integrated circuit die, a first of the second wiring segments electrically coupled on one end to one of the first wiring segments and electrically coupled on the other end to the first wiring segment of a wiring track in the first plurality of wiring tracks that is interrupted by the at least one row of through die vias, a second of the second wiring segments electrically coupled on one end to one of the first wiring segments and electrically coupled on the other end to the second wiring segment of a wiring track in the first plurality of wiring tracks that is interrupted by the at least one row of through die vias.

18. The device of claim 17, further comprising an additional metal layer on the first integrated circuit die, the additional metal layer electrically connected to the at least one row of through die vias, wherein the at least one row of through die vias, the first plurality of metal layers and the second plurality of metal layers extend between the additional metal layer and the substrate of the first integrated circuit die, wherein the at least one row of through die vias extend through each of the metal layers in the first plurality of metal layers and the second plurality of metal layers.

19. The device of claim 18, further comprising a second integrated circuit die that is attached to the backside of the first integrated circuit die, the second integrated circuit die electrically coupled to the contacts.

20. The device of claim 19, wherein, with the exception of the first wiring segments, all wiring on the second plurality of metal layers extends approximately orthogonally to the first direction.

* * * * *